(12) United States Patent
Tsuchiya et al.

(10) Patent No.: US 6,879,465 B2
(45) Date of Patent: Apr. 12, 2005

(54) INTEGRATED LEAD SUSPENSION AND METHOD OF CONSTRUCTION

(75) Inventors: Tatsumi Tsuchiya, Kanagawa-ken (JP); Yuhsuke Matsumoto, Fujisawa (JP); Takaaki Murokawa, Fujisawa (JP); Naoki Fujii, Fujisawa (JP); Takuya Satoh, Kanagawa-ken (JP); Yasuhiro Mita, Kanagawa-ken (JP); Hiroyasu Tsuchida, Fujisawa (JP); Yoshio Uematsu, Kanagawa-ken (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/459,343

(22) Filed: Jun. 11, 2003

(65) Prior Publication Data

US 2003/0188887 A1 Oct. 9, 2003

Related U.S. Application Data

(62) Division of application No. 10/255,454, filed on Sep. 26, 2002.

(30) Foreign Application Priority Data

Oct. 11, 2001 (JP) ........................................ 2001-313491

(51) Int. Cl.[7] ............................ G11B 21/22; G11B 5/54; H05K 1/11

(52) U.S. Cl. ...................... 360/245.4; 174/260; 174/261
(58) Field of Search .................................. 174/260, 261, 174/254, 250; 361/760, 774, 777; 29/840; 360/246.2, 245.2, 3, 245.9, 245.4

(56) References Cited

U.S. PATENT DOCUMENTS

| 4,940,181 | A | * | 7/1990 | Juskey et al. | .......... 228/180.21 |
| 5,737,152 | A | * | 4/1998 | Balakrishnan | ............ 360/245.9 |
| 6,316,737 | B1 | * | 11/2001 | Evans et al. | ................ 174/260 |
| 6,330,132 | B1 | * | 12/2001 | Honda | ...................... 360/234.5 |
| 6,349,017 | B1 | * | 2/2002 | Schott | ..................... 360/234.6 |
| 6,683,387 | B1 | * | 1/2004 | Brownfield | ................. 257/786 |

* cited by examiner

Primary Examiner—Kamand Cuneo
Assistant Examiner—J B Patel
(74) Attorney, Agent, or Firm—Bracewell & Patterson, L.L.P.

(57) ABSTRACT

An integrated lead suspension includes a solder ball that is placed between a lead wiring pad provided on a flexure of the suspension, and a bonding pad provided on a slider of a head gimbal section. The lead wiring pad and bonding pad are soldered by melting the solder ball. As a result, there is provided a recessed section into which a solder ball is placed by way of surface raised sections, using gravitational force, in the vicinity of the center line of the surface of the lead wiring pad. In this way the position of the solder ball is not displaced from the center line when a bonding pad and lead wiring pad are connected by means of a solder ball.

10 Claims, 15 Drawing Sheets

INTEGRATED LEAD SUSPENSION AND METHOD OF CONSTRUCTION

This is a divisional application Ser. No. 10/255,454, filed Sep. 26, 2002.

BACKGROUND OF THE INVENTION

1. Technical Field

The present invention relates to an integrated lead suspension that supports a magnetic head gimbal section of a hard disk drive, and more particularly to an integrated lead suspension that can improve problems that arise when a lead wiring pad provided on a flexure section of the suspension and a bonding pad provided on a slider of a head gimbal section of the suspension are joined.

2. Description of the Related Art

As hard disk drives have become smaller in recent years, the design and construction of the various parts of the suspension that moves the magnetic head have become more difficult, and, in particular, the task of connecting leads to the slider that holds the magnetic head has become extremely difficult. Moreover, the weight, wiring positions, and so forth, of the leads themselves have come to affect head control, and consequently integrated lead suspensions have come to be known in which variations due to wiring are suppressed by bonding a wiring section, or forming a wiring pattern, on the suspension.

With an integrated lead suspension, it is necessary to join together a lead wiring pad provided on the flexure section on the suspension side and a bonding pad provided on the slider, but the two connecting surfaces have a positional relationship such that the extended planes of the two pads are orthogonal (when the two planes are viewed from the side, a virtual right angle is formed at the point of intersection), and therefore the technology for connecting normal opposing planes cannot handle this case, and various new technologies are used.

For example, one known method for joining a lead wiring pad and bonding pad that have an orthogonal positional relationship is apple bonding, using a gold (Au) ball. With apple bonding, a gold ball is pushed into the virtual right angle formed by the above-described two pads, and connection is made by means of ultrasonic welding. An example of another method is a method using a solder ball for which application has been made by the present applicants in Japanese Patent Application No. 2000-189148 or Japanese Patent Application No. 2001-039888.

With a method using a solder ball, the integrated lead suspension is supported so that the virtual right angle formed by the above-described two pads faces upward vertically, and a solder ball is placed between the two pads. Following this, the solder is melted by irradiating the solder ball with a laser beam, connecting the two pads.

FIG. 15 is a drawing showing the case where the lead wiring pad and bonding pad are joined using a solder ball in a conventional integrated lead suspension. A suspension flexure 5 has a 2-layer construction comprising a polyamide layer 17, which is insulating polymeric material, and a stainless steel foil layer 18. A lead 10, which is a conductive layer, is further formed on the polyimide layer 17, and at the end of the lead 10 is formed a lead wiring pad 12 that is wider than the lead 10 so as to be of sufficient area for solder connection.

The shape of the polyimide layer 17 and stainless steel foil layer 18 can be processed by performing etching, for example, after coating the necessary parts with a resist. Also, when the polyimide layer 17 is a photosensitive polyimide layer, the shape can be processed by performing exposure and development after coating the necessary parts of the polyimide layer 17 with a resist or the like.

An aperture section 11 is formed in the tip section of the lead wiring pad 12 on the flexure 5 in order to prevent such problems as overflow of adhesive adhering to the lead wiring pad 12 when the slider is bonded to the suspension, or the polymeric polyimide layer 17 being altered by heat emission due to laser beam radiation. Therefore, the tip section of the lead wiring pad 12 comprises in-air wiring that projects into the aperture section 11.

A slider 6 that incorporates a magnetic head for a hard disk is attached to the flexure 5, and a bonding pad 15 of the slider 6 is placed in a position orthogonal to the lead wiring pad 12 as described above. Thus, the virtual orthogonal axes at which the plane extended from the plane of the bonding pad 15 intersects the plane extended from the plane of the lead wiring pad 12 form an angle of 90 degrees (a right angle).

When the bonding pad 15 and lead wiring pad 12 are connected with a solder ball, the suspension (flexure 5) is fixed in the direction in which the virtual right angle formed by the bonding pad 15 and lead wiring pad 12 opens upward in a vertical direction. Normally, the flexure 5 is fixed so that the lead wiring pad 12 on the flexure 5 and the bonding pad 15 on the slider 6 both form an angle 45 degrees above the horizontal while both maintaining a state in which the positional relationship of the two is orthogonal. Then a solder ball 400 is dropped from a solder ball transfer apparatus (not shown) between the two fixed pads. The two pads are then connected by melting the solder ball 400 by heating it by means of a laser beam radiation apparatus or the like (not shown).

With a conventional integrated lead suspension, the bonding pad 15 and lead wiring pad 12 are connected by means of a solder ball in this way. Integral-type wiring suspensions are classified into the three types below according to differences in their construction methods. In the construction of all three types, connection is performed as described above when the bonding pad 15 and lead wiring pad 12 are connected by means of a solder ball.

(a) An additive type in which copper foil wiring and pads are additively formed on insulating material of the suspension (b) A subtractive type in which wiring and pads are formed by being etched from copper foil formed as a sheet on insulating material of the suspension (c) An FPC type in which a flexible substrate (FPC) on which copper foil wiring and pads are formed is bonded to the suspension However, with a conventional integrated lead suspension, when the bonding pad 15 and lead wiring pad 12 are connected by means of a solder ball there is problem in that, since the solder ball is almost spherical and the surfaces of the bonding pad 15 and lead wiring pad 12 are almost flat, the solder ball rolls in the virtual right-angle axis direction (direction A or direction B in FIG. 15) at which the extended planes of the two pads are orthogonal, and the position of the solder ball is displaced from the center line CL of each pad shown in FIG. 15. This problem arises in a similar way with all the above-described types.

Also, with the additive type, in particular, die wear occurs whereby areas near the edge take on an inclined beveled shape as shown in 12a through 12c in FIG. 15, as a result of which the area of the flat section 12d diminishes, and moreover, the surface of remaining flat section 12d is rough and has undulations. Consequently, the additive type is more susceptible than the other types to the problem of displacement of the position of the solder ball from the center line CL.

If the position of the solder ball is displaced from the center line, when the two pads are connected by melting the solder ball with laser beam radiation, there arises a solderless state in which there is no solder ball in the connecting region, or a solder connection defect because the solder ball, although in the connecting region, is displaced from the center line. Solder connection defects may include, in the case where solder does not connect both pads, partial soldering in which only parts of the two pads are imperfectly soldered, or a bridge connection that connects adjacent pads of the same kind.

The present invention has been devised in order to solve such conventional problems as described above, and has as its object the provision of an integrated lead suspension whereby, when a bonding pad and lead wiring pad are connected by means of a solder ball, the position of the solder ball is not displaced from the center line.

SUMMARY OF THE INVENTION

In order to achieve the above-described object, an integrated lead suspension of the present invention comprises a lead wiring pad provided on the flexure section of the suspension, a bonding pad provided on the slider of the head gimbal section of the suspension, and a solder ball that is placed between the lead wiring pad and the bonding pad, so that the lead wiring pad and bonding pad are soldered by melting the solder ball; and a recessed section is provided into which the solder ball is dropped from the surface of the lead wiring pad, using the force of gravity, in the vicinity of the center line of the surface of the lead wiring pad.

The recessed section of an integrated lead suspension of the present invention may be configured so that a difference in level, a curved surface, or an inclined surface is formed between the part into which the solder ball is dropped and the portions on both sides thereof.

The recessed section of an integrated lead suspension of the present invention may be configured so that the distances from the center line of the part into which the solder ball is dropped to the portions on both sides thereof are equal.

The recessed section of an integrated lead suspension of the present invention may have the part into which the solder ball is dropped that has a groove shape parallel to the center line or a notched section.

The recessed section of an integrated lead suspension of the present invention may have the part into which the solder ball is dropped that has a U-shape with the opening side facing downward and the portions on both sides thereof parallel to the center line, or a V-shape with the opening side facing downward and the portions on both sides thereof extending from the apex positioned on the center line toward the opening side.

A construction method of an integrated lead suspension of the present invention comprises providing a lead wiring pad on a flexure section of the suspension, providing a bonding pad on a slider of a head gimbal section of the suspension, and placing a solder ball between the lead wiring pad and the bonding pad, so that the solder ball is melted to solder the lead wiring pad and bonding pad together, and when a lead wiring pad is formed using etching technology, a recessed section is simultaneously formed into which a solder ball is dropped from the surface of the lead wiring pad, using the force of gravity, in the vicinity of the center line of the surface of that lead wiring pad.

A construction method of an integrated lead suspension of the present invention may comprise providing a lead wiring pad a flexure section of the suspension, providing a bonding pad on a slider of a head gimbal section of the suspension, and placing a solder ball between the lead wiring pad and the bonding pad, so that the solder ball is melted to solder the lead wiring pad and bonding pad together wherein the construction method may comprise the steps of: first forming a lead wiring pad having a flat surface, and thereafter providing a recessed section into which a solder ball is dropped from the surface of the lead wiring pad, using the force of gravity, in the vicinity of the center line of the surface of the lead wiring pad.

A construction method of an integrated lead suspension of the present invention may provide a recessed section using etching technology, bending, or die press working.

When an integrated lead suspension of the present invention is of additive type, the construction method may comprise the steps of: first forming a lead wiring pad having a flat surface using copper plating technology, and thereafter causing protrusion by plating additional copper on the portions on both sides thereof excluding the vicinity of the center line of the surface of the lead wiring pad and providing a relatively recessed section.

When an integrated lead suspension of the present invention is of additive type, the construction method may comprise the steps of: first forming an underlying recessed section using etching technology on an underlying layer of the lead wiring pad, and thereafter forming a recessed section by forming a lead wiring pad using copper plating technology on that underlying layer.

DESCRIPTION OF THE PRESENT INVENTION

The present invention will now be described in detail based on the embodiments shown in the attached drawings.

Figure 1:
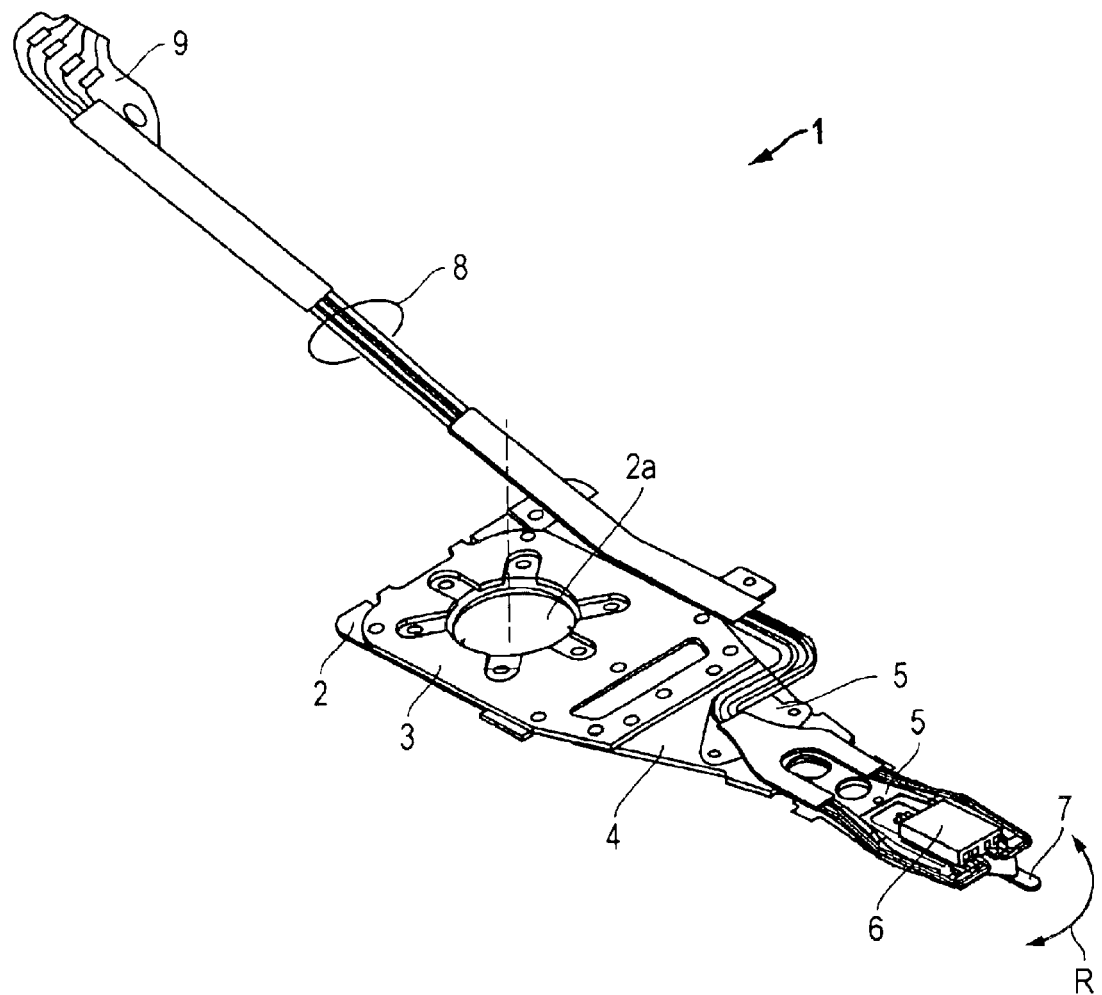
FIG. 1 is an oblique drawing showing the overall configuration of an integrated lead suspension according to Embodiment 1 of the present invention.
Figure 2:
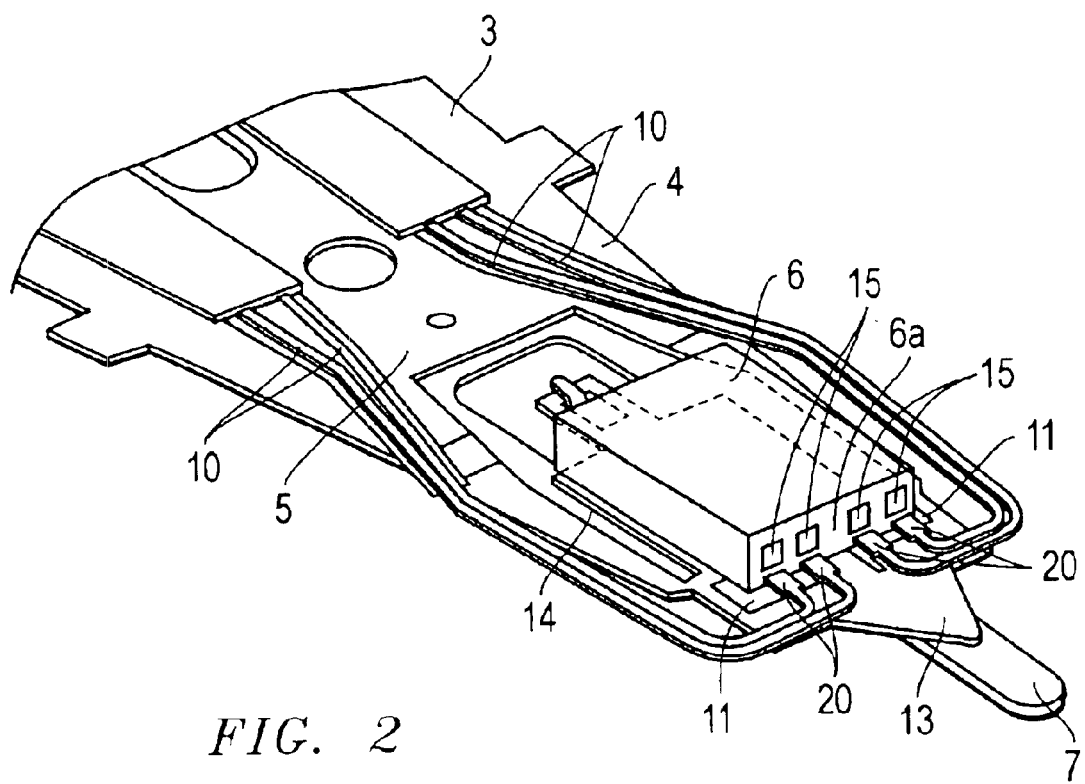
FIG. 2 is an expanded partial drawing of the tip section on which a slider is located in the integrated lead suspension shown in FIG. 1.

FIG. 1 is an oblique drawing showing the overall configuration of an integrated lead suspension according to Embodiment 1 of the present invention, and FIG. 2 is an expanded partial drawing of the tip section on which a slider is located in the integrated lead suspension shown in FIG. 1.

An integrated lead suspension 1 mainly comprises a base plate 2, load beam 4, suspension plate 3, and flexure 5. An aperture section 2a formed in the base plate 2 is supported by suspension support means of a hard disk drive (not shown), and the integrated lead suspension 1 rotates in the directions of arrows R, centered on the aperture section. 2a.

The suspension plate 3 is bonded to the base plate 2, and the load beam 4 is fixed to the suspension plate 3. The suspension plate 3 is flexibly supported by the base plate 2, and the desired suspension characteristics are obtained by means of the formed aperture section. The load beam 4 is extended in a direction radiating from the axis of rotation about which the integrated lead suspension 1 rotates, and a tab 7 is formed on its tip section.

The flexure 5 is a lead support mechanism that extends in a crank shape from the tip section of the integrated lead suspension 1 to a multi-connector section 9, and is laser-welded to the load beam 4 at three places and is also fixed to the base plate 2. On the upper surface of this flexure 5 (the surface uppermost in FIG. 1), four leads 8 are arranged via an insulating sheet so as not to be in mutual contact. The principal parts of these leads are protected by a protective sheet.

The vicinity of the tip section of the flexure 5 is fixed to the load beam 4, but the leads forward of that fixed part are free of the load beam 4, and here an arch-shaped aperture section is formed. The slider 6 is bonded to a flexure tang 14 that is formed projecting toward the center of the arch-shaped aperture section from a platform 13 of the most forward part of the flexure 5.

As regards this flexure tang 14, a position at the center of the slider 6 is supported by a pivot (not shown) projecting from the load beam 4. By this means, the slider 6 can maintain predetermined amounts of inclination (called pitch, roll, and yaw) in all directions with respect to the load beam 4.

The four leads 8 shown in FIG. 1 are divided into pairs of leads 10 from where they emerge from the protective sheet toward the most forward part as shown in FIG. 2, and arrive at the platform 13 after bending through almost a right angle, floating free, at the side of the aperture section 11. On the platform 13, the leads 10 bend again through almost a right angle toward four bonding pads 15 formed on the most forward side 6a of the slider 6.

At the end of each bent lead 10 is formed a lead wiring pad 20 that is to be connected to a bonding pad 15 formed on the most forward side 6a of the slider 6. An aperture section 11 is formed between the platform 13 and flexure tang 14, which is the solder connection area for the bonding pads 15 and lead wiring pads 20.

Next, the method of connecting a bonding pad 15 and lead wiring pad 20 using a solder ball will be described. In summary, the integrated lead suspension 1 is first supported so that the right angle formed at the intersection of the surface (connecting surface) of a bonding pad 15 and the surface (connecting surface) of a lead wiring pad 20 faces upward in a vertical direction, and then a solder ball is placed between the two pads, after which the two pads are connected by irradiating the solder ball with a laser beam.

First, the method will be described below whereby the integrated lead suspension 1 is supported so that the right-angle section formed by the surface of a bonding pad 15 and the surface of a lead wiring pad 20 faces upward in a vertical direction.

Figure 3:
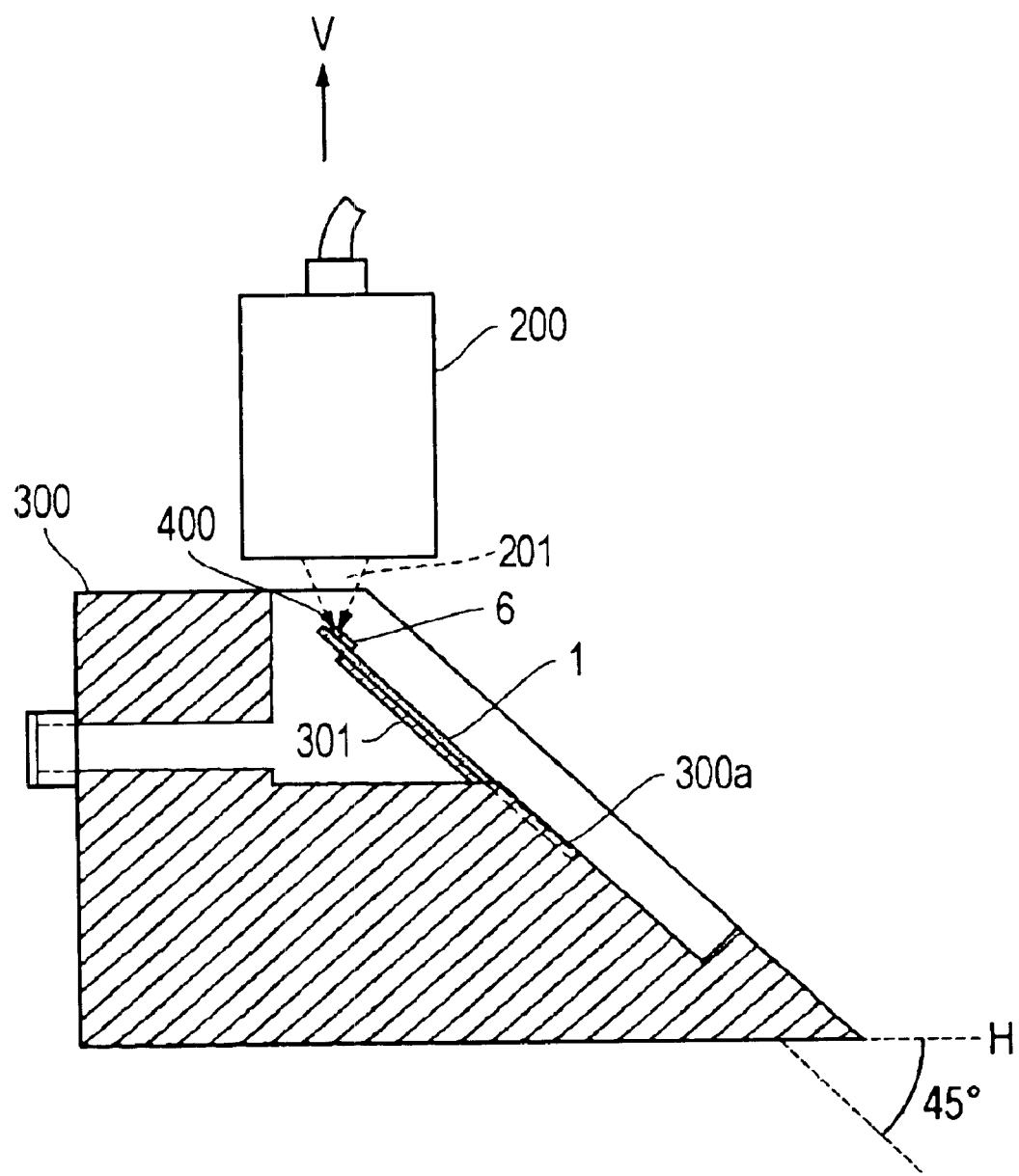
FIG. 3 is a cross-sectional drawing showing a solder ball joining apparatus that connects two pads by irradiating a solder ball placed between the two pads with a laser beam.

FIG. 3 is a cross-sectional drawing showing a solder ball joining apparatus that connects the two pads by irradiating a solder ball placed between the two pads with a laser beam. This is a main configuration drawing showing an approaching optical (laser) apparatus 200 that is to irradiate the solder ball 400 with a laser beam 201, a work jig 301 that supports the integrated lead suspension 1, and a mounting stand 300 that supports this work jig 301.

The mounting stand 300 has a mounting surface 300a at a 45-degree incline to the horizontal plane H, and work jig 301 is placed on this mounting surface 300a so that it is also at a 45-degree incline to the horizontal plane H. The slider 6 is placed on the work jig 301, and the integrated lead suspension 1 is mounted with the slider 6 toward its upper surface.

At this time, in the integrated lead suspension 1 supported by the work jig 301, the joining surfaces of the bonding pads at its tip section and the joining surfaces of the opposing lead wiring pads are at practically 45 degrees to the horizontal plane. In this way, the virtual right-angle section formed by the surface of a bonding pad 15 and the surface of a lead wiring pad 20 is supported so as to open toward the upper part of the vertical direction V on the work jig 301.

Next, a solder ball 400 is placed between the two pads, and then the solder ball 400 is irradiated with a laser beam 201. As the method of placing the solder ball 400 between the two pads and performing laser beam 201 radiation is disclosed in detail by the present applicants in Japanese Patent Application No. 2000-189148 and Japanese Patent Application No.2001-039888, and the method of placing the solder ball 400, the configuration of the optical apparatus 200, and so forth, are not directly relevant to the present application, only a brief description thereof will be given here.

The optical apparatus 200 is a fiber laser termination module that uses an optical fiber in a resonator, has a series of optical lenses arranged in an internal optical path, and forms an aerial laser beam path space. The optical lenses converge scattered light output from the optical fiber, and output this as a laser beam 201 from the forward section of the optical apparatus 200.

Figure 4:
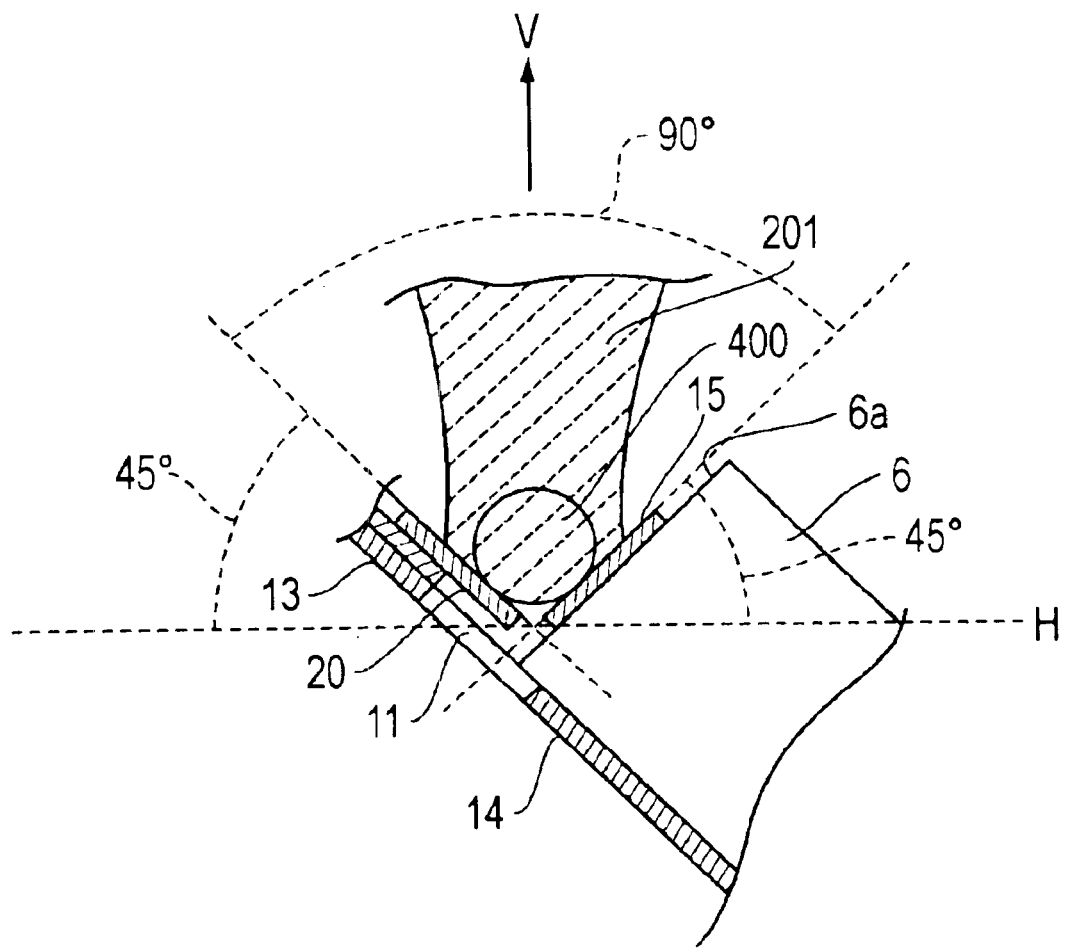
FIG. 4 is a cross-sectional drawing showing an enlarged view of the state where a solder ball is positioned at the tip section of an integrated lead suspension supported by the work jig shown in FIG. 3.

FIG. 4 is a cross-sectional drawing showing an enlarged view of the state where a solder ball is positioned at the tip section of the integrated lead suspension 1 supported by the work jig 301 shown in FIG. 3. A bonding pad 15 and lead wiring pad 20 are positioned so as to each be raised 45 degrees above the horizontal plane, the plane extended from the surface of the bonding pad 15 and the plane extended from the surface of the lead wiring pad 20 are orthogonal, and a virtual right angle is formed between the two pads. The virtual right angle opens toward the top of the vertical direction V, and is set to an angle suitable for catching a solder ball 400 supplied from above.

When a solder ball 400 transported by means of suction pad is placed, and comes to rest, so as to touch the joining surfaces of the bonding pad 15 and lead wiring pad 20, the optical apparatus 200 is moved to the radiation position by means of moving means (not shown), and the solder ball 400 is irradiated with a laser beam 201 converged to a predetermined spot diameter.

In the period from placement of this solder ball 400 until it is irradiated with the laser beam 201, a predetermined quantity of nitrogen gas $N_2$ constituting an inert atmosphere is injected from a nitrogen gas entry pipe of the mounting stand 300 in order to suppress solder oxidation. By this means, the bonding pad 15, lead wiring pad 20, and solder ball 400 are placed in an inert atmosphere. When nitrogen gas is injected, the injection location and flow rate are considered to prevent a change in the position of the stationary solder ball due to the gas pressure during injection, but even so, the solder ball may move due to the injection of nitrogen gas if the surface condition of the pads is poor, for example.

While this inert atmosphere is maintained, the optical apparatus 200 emits a laser beam 201 and melts the solder ball 400 by heating it, so connecting the bonding pad 15 and lead wiring pad 20. If the external diameter of the solder ball is around 120 mm, for example, the spot diameter of the laser beam at this time is set to around 150 to 200 mm.

As a result of melting the solder in an inert atmosphere produced by nitrogen gas $N_2$ in this way, inert nitrogen gas $N_2$ coats the solder surface when the solder cools and forms a joint after melting, thus enabling oxidation of the solder to be prevented.

Figure 5:
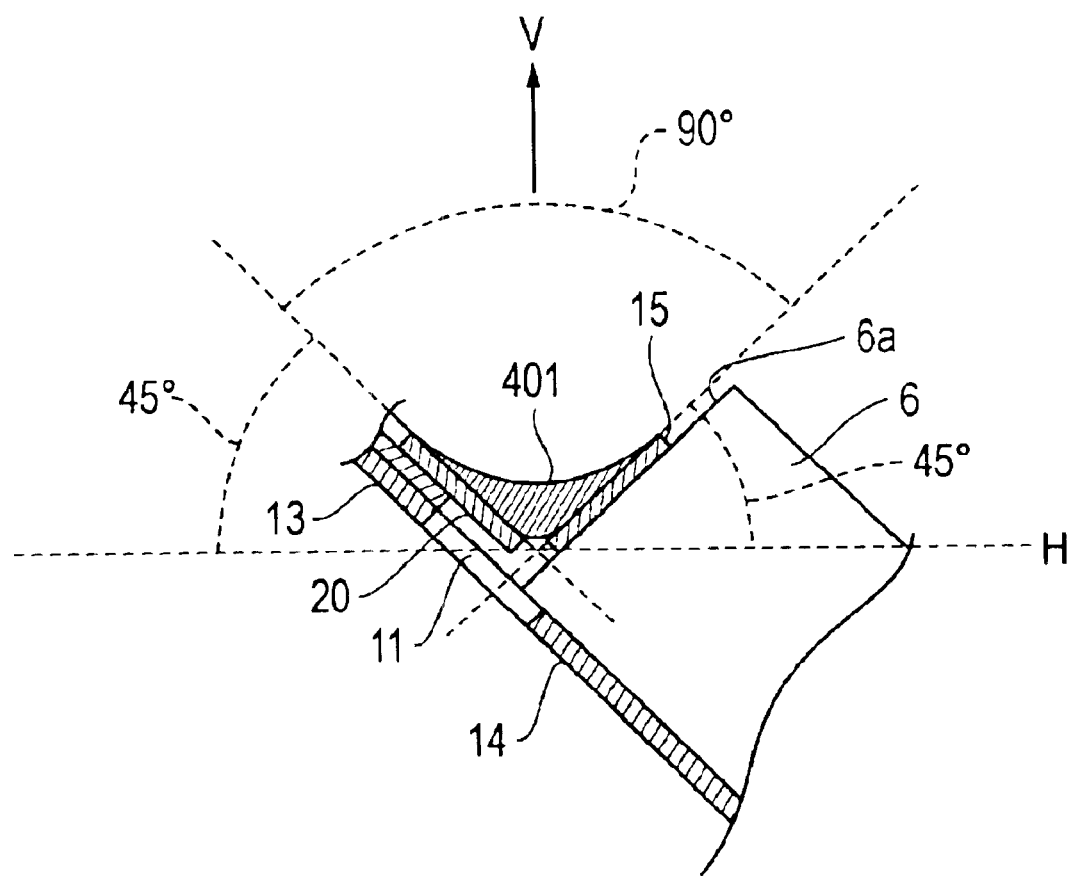
FIG. 5 is a cross-sectional drawing showing an enlarged view of the state where the solder ball shown in FIG. 4 has melted and joined a bonding pad and a lead wiring pad.

FIG. 5 is a cross-sectional drawing showing an enlarged view of the state where the solder ball shown in FIG. 4 has melted and joined the bonding pad 15 and lead wiring pad 20. The melted solder 401 spreads upward on both the bonding pad 15 connecting surface and the lead wiring pad 20 connecting surface due to the wettability of the solder, and forms a shape that connects the two pads. The melted solder spreads to the front surface at the top of both the bonding pad 15 connecting surface and the lead wiring pad 20 connecting surface, and if the two are connected in an inverted arch shape as shown in FIG. 5, a fillet 401 showing a good connection state is formed. In order for a good connection state such as that shown in FIG. 5 to be achieved, the solder ball 400 must be placed in the vicinity of the center line of the side direction (virtual right angle axis direction) on each pad.

Figure 6:
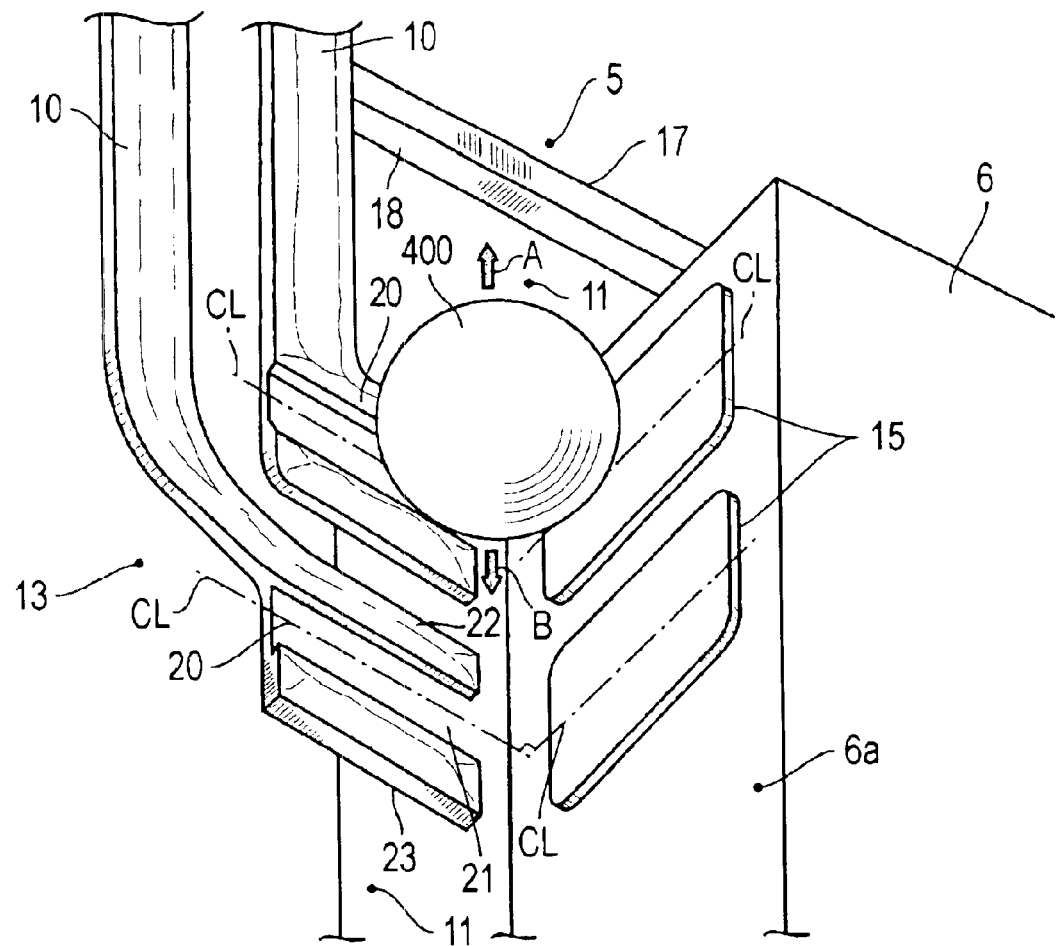
FIG. 6 is an oblique drawing showing an enlarged view of the main parts in an integrated lead suspension according to Embodiment 1 of the present invention.

FIG. 6 is an oblique drawing showing an enlarged view of the main parts in an integrated lead suspension of this embodiment, and shows the area where a lead wiring pad and bonding pad are joined using a solder ball. The difference between the integrated lead suspension of this embodiment shown in FIG. 6 and the conventional integrated lead suspension shown in FIG. 15 lies only in the structure of the lead wiring pads 20. Otherwise the configuration is the same as that of the conventional integrated lead suspension shown in FIG. 15.

Figure 15:
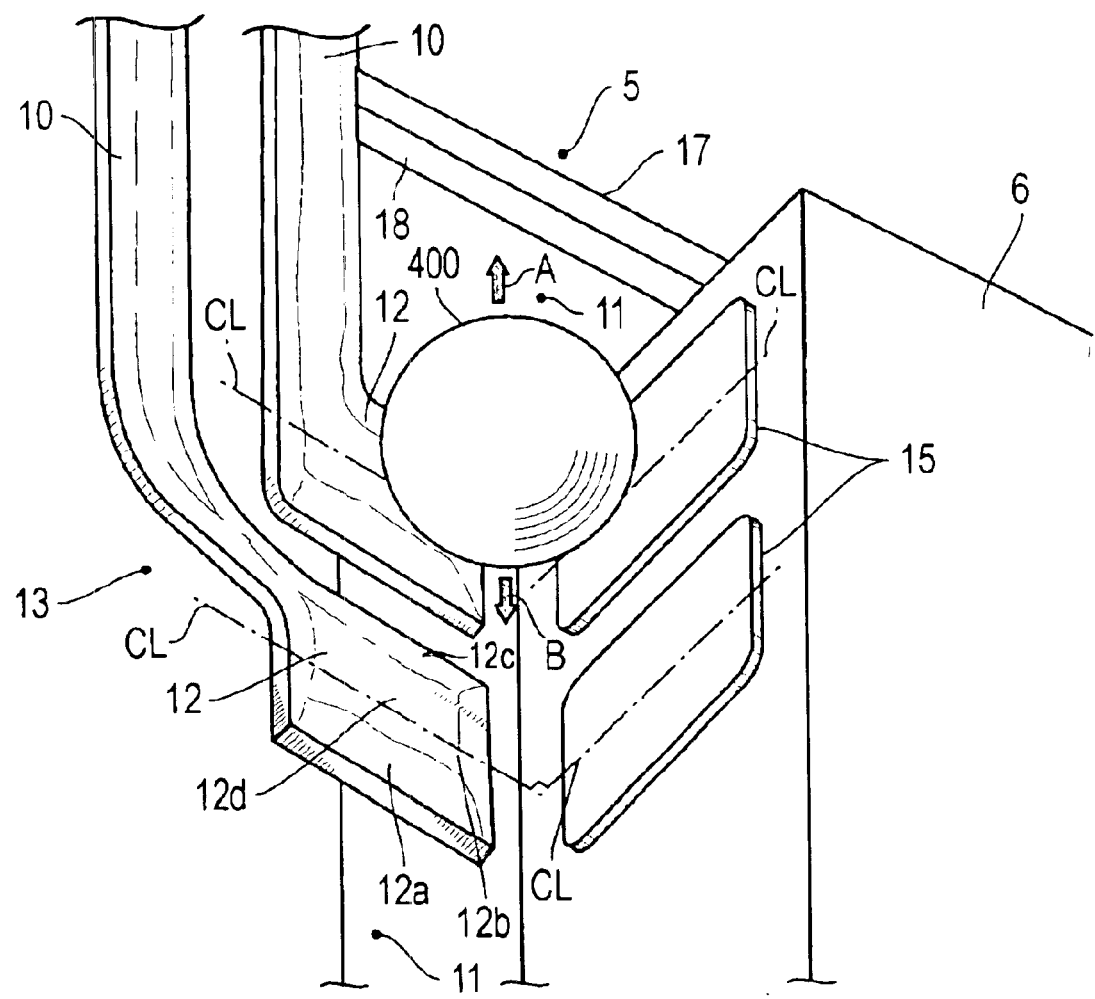
FIG. 15 is a drawing showing the case where a lead wiring pad and bonding pad are joined using a solder ball in a conventional integrated lead suspension.

With a lead wiring pad 20 of this embodiment, the same kind of pad as a conventional lead wiring pad shown in FIG. 15 is first formed, and then etching is further performed on its surface. A pad of the same kind as a conventional lead wiring pad is formed, in the case of a subtractive type or FPC type integrated lead suspension, by coating areas requiring a Cu (copper) foil layer with a resist, etching other parts, and then removing the resist; and in the case of an additive type integrated lead suspension, by setting a seed layer on a polyimide layer 17 by means of sputtering, performing Cu (copper) plating after coating unnecessary areas thereupon with a resist, and then removing the resist. In this embodiment, following this, half-etching is performed after coating raised section 22 and raised section 23 with another resist, and the recessed groove section (recessed section) 21 shown in FIG. 6 is provided on the lead wiring pads 20.

As a result, a recessed groove section 21 is formed by half-etching along the center line CL in a lead wiring pad 20 of this embodiment, and unetched raised section 22 and raised section 23 remain on either side of the recessed groove section 21, so that a difference in level is provided between the recessed groove section 21 and raised section 22 and between the recessed groove section 21 and raised section 23.

This difference in level need not be a sharply-defined difference in level as shown in FIG. 6, but, for example, may be configured so that the recessed groove section 21 sinks gently below raised section 22 and raised section 23 on a curved surface, or may be configured so that the recessed groove section 21 sinks gently below raised section 22 and raised section 23 on an inclined surface.

Due to the formation of this difference in level, a solder ball 400 is dropped into the recessed groove section 21—that is, between raised section 22 and raised section 23—under the force of gravity, and is temporarily fixed so that the center of the solder ball 400 substantially coincides with the center line CL on the recessed groove section 21 and does not move in the virtual right angle axis direction between the two pads. As a result, the solder ball 400 will no longer move even if subjected to some kind of stress in the virtual right angle axis direction (direction A or direction B shown in FIG. 6) due to the subsequent injection of nitrogen gas, etc., or vibration when the optical apparatus 200 moves, for example.

As the dimensions of the recessed groove section 21, if, for example, the width of a lead wiring pad 20 is 148 mm and the diameter of the solder ball is 120 mm, a width (74 mm) of half the width of a lead wiring pad 20 and a thickness of half the thickness of a lead wiring pad 20 are appropriate.

In this embodiment, a difference in level is provided between a recessed groove section 21 in the vicinity of the center line CL and the peripheral areas by etching on a lead wiring pad 20, but the recessed groove section 21 may also be formed not by providing a difference in level with respect to peripheral areas by etching, but, for example, by sinking the vicinity of the center line CL gently on a curved surface that continues from the peripheral areas, or by sinking the vicinity of the center line CL on an incline from the peripheral areas toward the vicinity of the center line CL.

In this embodiment, a recessed groove section 21 is formed using half-etching around the center line CL of a lead wiring pad 20, but another shape may also be formed by etching, as long as it is a shape that allows a solder ball 400 to be dropped into it by force of gravity. For example, an oval or circular recessed section, or a rhomboidal or rectangular recessed section, may be provided in the vicinity of the center of a lead wiring pad 20 by etching.

Thus, with an integrated lead suspension of this embodiment, through the provision of a recessed groove section 21 in a lead wiring pad 20 by means of half-etching, the center of a solder ball 400 substantially coincides with the center line CL of the lead wiring pad 20, and is temporarily fixed so that it does not move in the virtual right angle axis direction between the two pads, as a result of which the solder ball 400 will no longer move in the right angle axis direction even if subjected to some kind of stress in the virtual right angle axis direction due to subsequent injection of an inert gas or movement of the optical apparatus 200, for example, thereby enabling the good solder connection state shown in FIG. 5 to be achieved.

Figure 7:
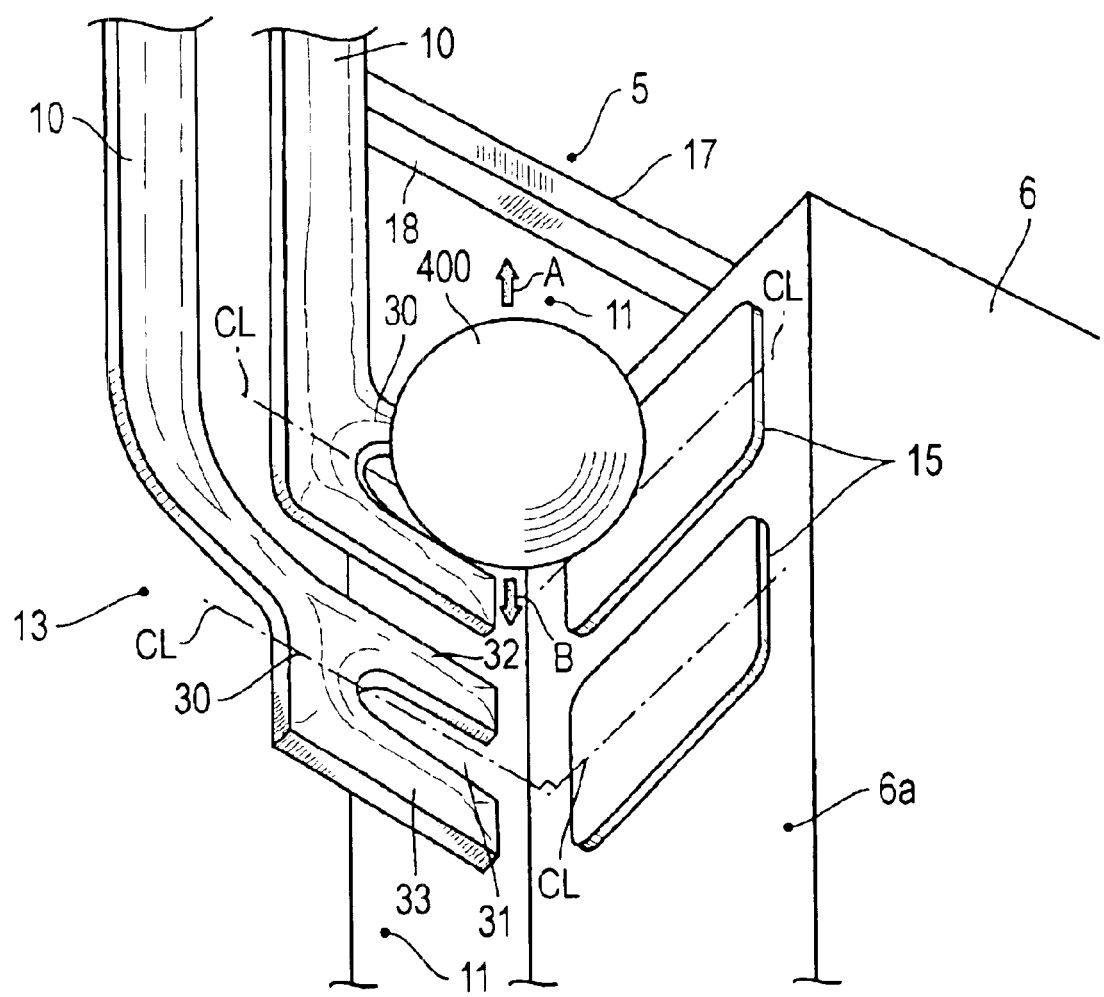
FIG. 7 is an oblique drawing showing an enlarged view of the main parts in an integrated lead suspension according to Embodiment 2 of the present invention.

FIG. 7 is an oblique drawing showing an enlarged view of the main parts in an integrated lead suspension according to Embodiment 2 of the present invention. The only difference between this embodiment and Embodiment 1 is that the shape of the lead wiring pads 30 is different. Otherwise the configuration is the same as that of the integrated lead suspension according to Embodiment 1 shown in FIGS. 1–6.

A lead wiring pad 30 of this embodiment is formed, in the case of a subtractive type or FPC type integrated lead suspension, by coating areas requiring a Cu (copper) foil layer with a resist, etching other parts, and then removing the resist; and in the case of an additive type integrated lead suspension, by setting a seed layer on a polyimide layer by means of sputtering, performing Cu (copper) plating after coating unnecessary areas thereupon with a resist, and then removing the resist. At this time, the U-shaped notched section (recessed section) 31 shown in FIG. 7 is formed in each lead wiring pad 30 by changing the resist.

The U-shaped notched section 31 is formed so that the straight-line parts of a U with the aperture facing downward are parallel to the center line CL. On either side of the U-shaped notched section 31 a fork section (raised section) 32 and fork section (raised section) 33 are formed, and a space parallel to the center line CL is formed by the U-shaped notched section 31 between fork section 32 and fork section 33.

Due to the formation of this space by the U-shaped notched section 31, a solder ball 400 is dropped into the U-shaped notched section 31—that is, between fork section 32 and fork section 33—under the force of gravity, and is temporarily fixed so that the center of the solder ball 400 substantially coincides with the center line CL on the U-shaped notched section 31 and does not move in the virtual right angle axis direction between the two pads. As a result, the solder ball 400 will no longer move even if subjected to some kind of stress in the virtual right angle axis direction (direction A or direction B shown in FIG. 7) due to the subsequent injection of nitrogen gas, etc., or vibration when the optical apparatus 200 moves, for example.

As the width of the section parallel to the center line CL in the U-shaped notched section 31, if, for example, the width of a lead wiring pad 30 is 148 mm and the diameter of the solder ball is 120 mm, a width of half (74 mm) or ⅓ (approx. 49 mm) the width of a lead wiring pad 30 is appropriate. As for the curved section of the U-shaped notched section 31, any arc-shaped curve can be used that enables the parallel sections on either side to be connected.

In this embodiment, a U-shaped notched section 31 is formed peripheral to the center line CL of a lead wiring pad 30, but a different shape may also be formed as long as it is a shape that enables a solder ball 400 to be dropped into it under the force of gravity. For example, an oval or circular notched section may be provided in the vicinity of the center of a lead wiring pad 30.

Thus, with an integrated lead suspension of this embodiment, through the provision of a U-shaped notched section 31 in a lead wiring pad 30, in the same way as in above-described Embodiment 1, the center of a solder ball 400 substantially coincides with the center line CL of the lead wiring pad 30, and is temporarily fixed so that it does not move in the virtual right angle axis direction between the two pads, as a result of which the solder ball 400 will no longer move in the right angle axis direction even if subjected to some kind of stress in the virtual right angle axis direction due to subsequent injection of an inert gas or movement of the optical apparatus 200, for example, thereby enabling the good solder connection state shown in FIG. 5 to be achieved.

Figure 8:
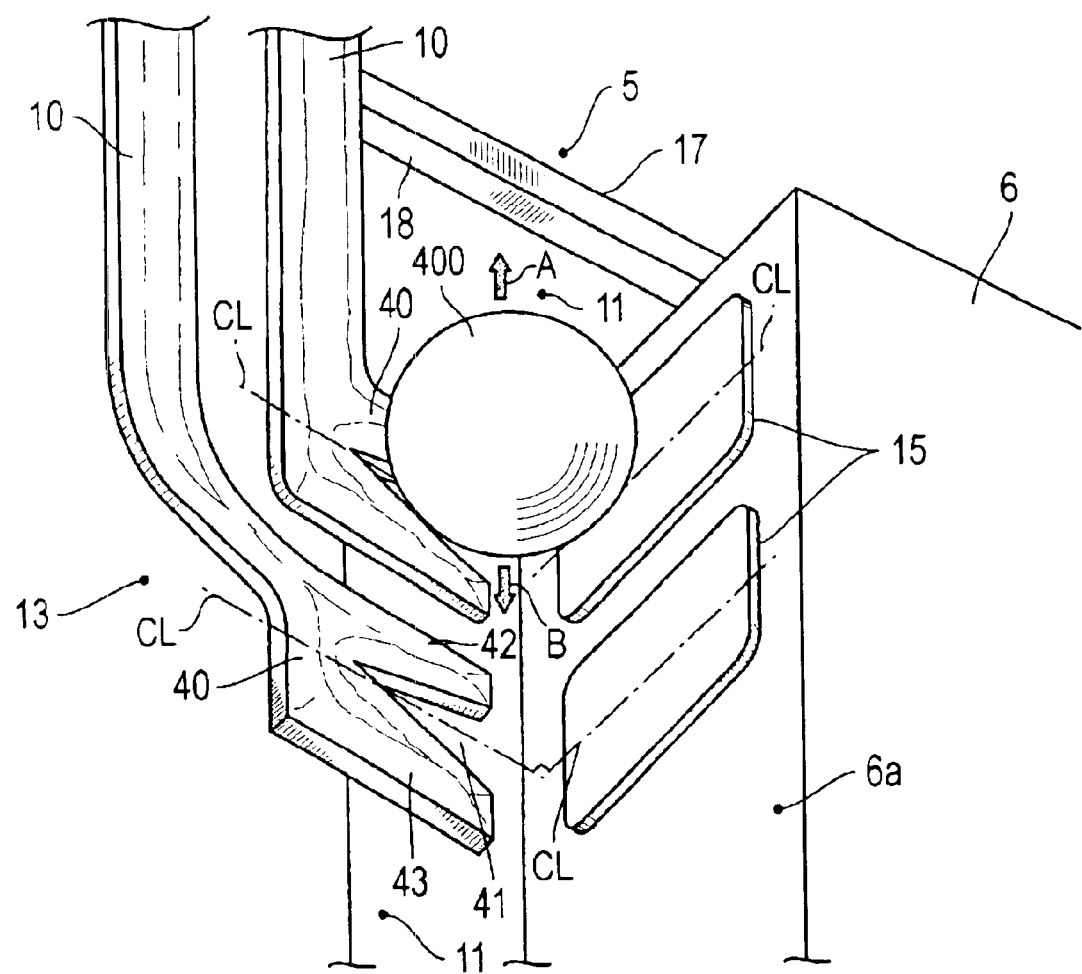
FIG. 8 is an oblique drawing showing an enlarged view of the main parts in an integrated lead suspension according to Embodiment 3 of the present invention.

FIG. 8 is an oblique drawing showing an enlarged view of the main parts in an integrated lead suspension according to Embodiment 3 of the present invention. The only difference between this embodiment and Embodiment 2 is that the shape of the lead wiring pads 40 is different. Otherwise the configuration is the same as that of the integrated lead suspension according to Embodiment 2 shown in FIG. 7.

As the method of forming a lead wiring pad 40 of this embodiment, in the same way as in the Embodiment 2, in the case of a subtractive type or FPC type integrated lead suspension, the pad is formed by etching parts not coated with a resist, and in the case of an additive type integrated lead suspension, by performing Cu (copper) plating of parts not coated with a resist. At this time, the V-shaped notched section (recessed section) 41 shown in FIG. 8 is formed in each lead wiring pad 40 by changing the resist.

The V-shaped notched section 41 is formed so that the aperture of a V with the opening side facing downward is at the tip of the lead wiring pad 40, and a straight line from the apex of the V through the midpoint of the two sides of the aperture of the V coincides with the center line CL. On either side extending from the apex of the V of the V-shaped notched section 41 toward the aperture of the V, a fork section (raised section) 42 and fork section (raised section) 43 are formed, and a space that gradually widens as it approaches the connecting area is formed by the V-shaped notched section 31 between fork section 42 and fork section 43.

Due to the formation of this space by the V-shaped notched section 41, a solder ball 400 is dropped into the V-shaped notched section 41—that is, between fork section 42 and fork section 43—under the force of gravity, and is temporarily fixed so that the center of the solder ball 400 substantially coincides with the center line CL on the V-shaped notched section 41 and does not move in the virtual right angle axis direction between the two pads. As a result, the solder ball 400 will no longer move even if subjected to some kind of stress in the virtual right angle axis direction (direction A or direction B shown in FIG. 8) due to the subsequent injection of nitrogen gas, etc., or vibration when the optical apparatus 200 moves, for example.

As the width of the section parallel to the center line CL in the V-shaped notched section 41, if for example, the width oaf lead wiring pad 40 is 148 mm and the diameter of the solder ball is 120 mm, the angle of the V-shaped notched section 41 should be determined so as to contact the lead wiring pad 40 at a point where the width is ⅓ (approx. 49 mm) the width of a lead wiring pad 40.

In this embodiment, a V-shaped notched section 41 is formed peripheral to the center line CL of a lead wiring pad 40, but a different shape may also be formed as long as it is a shape that enables a solder ball 400 to be dropped into it under the force of gravity. For example, a rectangular or rhomboidal notched section may be provided in the vicinity of the center of a lead wiring pad 40.

Thus, with an integrated lead suspension of this embodiment, through the provision of a V-shaped notched section 41 in a lead wiring pad 40, in the sane way as in the other embodiments described above, the center of a solder ball 400 substantially coincides with the center line CL of the lead wiring pad 40, and is temporarily fixed so that it does not move in the virtual right angle axis direction between the two pads, as a result of which the solder ball 400 will no longer move in the right angle axis direction even if subjected to some kind of stress in the virtual right angle axis direction due to subsequent injection of an inert gas or movement of the optical apparatus 200, for example, and moreover, the fact that the shape of the V-shaped notched section 41 is a V also makes it difficult for the solder ball 400 to move toward the apex of the V, and so makes the solder ball 400 all the more stable, thereby enabling the good solder connection state shown in FIG. 5 to be achieved.

Figure 9:
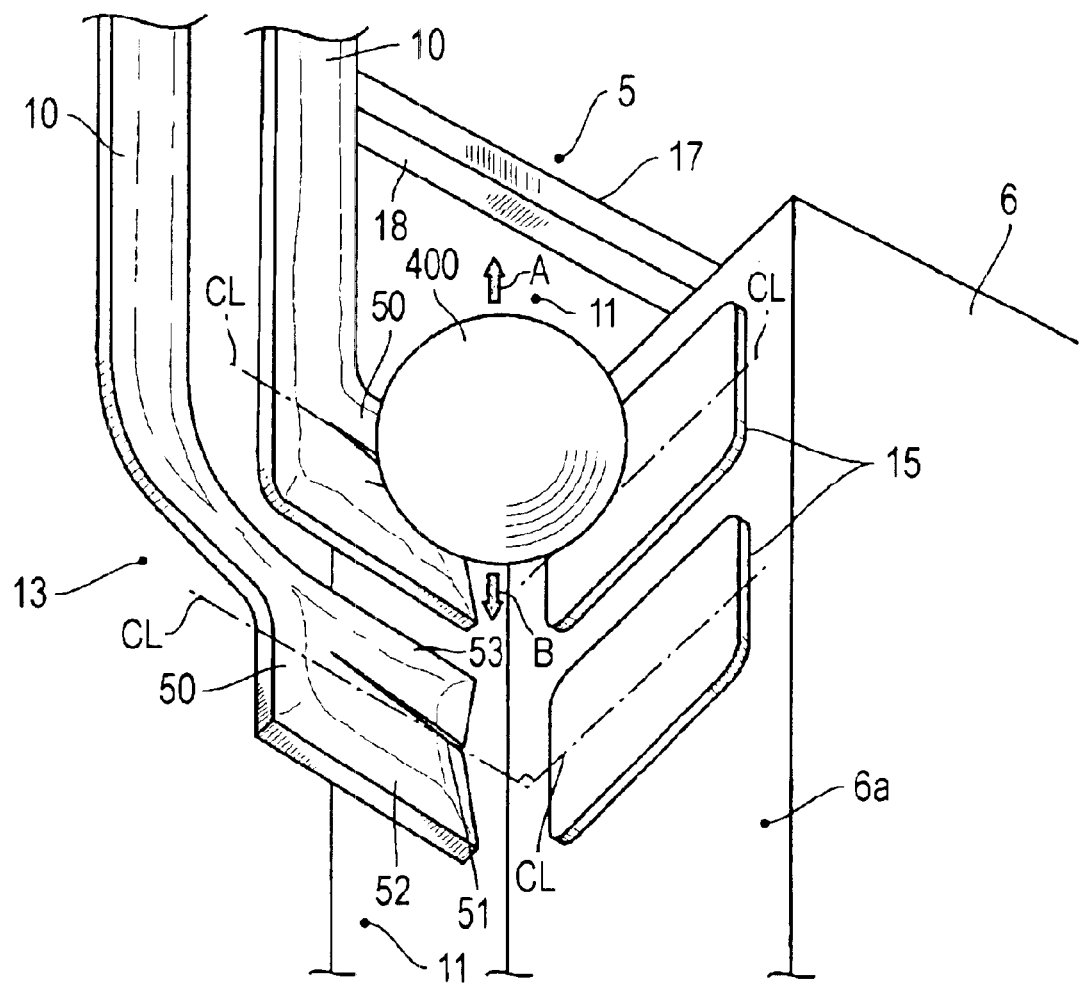
FIG. 9 is an oblique drawing showing an enlarged view of the main parts in an integrated lead suspension according to Embodiment 4 of the present invention.

FIG. 9 is an oblique drawing showing an enlarged view of the main parts in an integrated lead suspension according to Embodiment 4 of the present invention. The only difference between this embodiment and Embodiment 1 is that the shape of the lead wiring pads 50 is different. Otherwise the configuration is the same as that of the integrated lead suspension according to Embodiment 1 shown in FIGS. 1 through 6.

With a lead wiring pad 50 of this embodiment, the same kind of pad as a conventional lead wiring pad shown in FIG. 15 is first formed, in the same way as in Embodiment 1, and then bending is further performed on that pad. The method of forming a pad of the same kind as a conventional lead wiring pad is the same as in Embodiment 1. In this embodiment, following this, the lead wiring pads 50 are further deformed using a die or the like (not shown), and the bent section 51 shown in FIG. 9 is formed in each lead wiring pad 50.

As a result, a bent section (recessed section) 51 is formed along the center line CL in each lead wiring pad 50 of this embodiment, and on either side of the bent section 51 are formed an inclined section (raised section) 52 and inclined section (raised section) 53 sloping toward the bent section 51.

As the bent section 51 is linear in shape and is formed so as to coincide with the center line CL, and inclined section 52 and inclined section 53 on either side of the bent section 51 slope toward the bent section 51, a solder ball 400 is dropped into the bent section 51—that is, between inclined section 52 and inclined section 53—under the force of gravity, and is temporarily fixed so that the center of the solder ball 400 substantially coincides with the center line CL on the bent section 51 and does not move in the virtual right angle axis direction between the two pads. As a result, the solder ball 400 will no longer move even if subjected to some kind of stress in the virtual right angle axis direction (direction A or direction B shown in FIG. 9) due to the subsequent injection of nitrogen gas, etc., or vibration when the optical apparatus 200 moves, for example.

In this embodiment, a single bent section 51 is formed coincident with the center line CL of a lead wiring pad 50, but a plurality of bent sections may also be formed centered on the center line CL, as long as their shape enables a solder ball 400 to be dropped into them under the force of gravity.

Also, the bent section 51 is not limited to the case where a bend is made in a straight line as shown in FIG. 9, and the bent section 51 may also be configured, for example, so as to sink gently on a curved surface.

Thus, with an integrated lead suspension of this embodiment, through the provision of a bent section 51 in a lead wiring pad 50, in the same way as in the other embodiments described above, the center of a solder ball 400 substantially coincides with the center line CL of the lead wiring pad 50, and is temporarily fixed so that it does not move in the virtual right angle axis direction between the two pads, as a result of which the solder ball 400 will no longer move in the right angle axis direction even if subjected to some kind of stress in the virtual right angle axis direction due to subsequent injection of an inert gas or movement of the optical apparatus 200, for example, thereby enabling the good solder connection state shown in FIG. 5 to be achieved.

Figure 10:
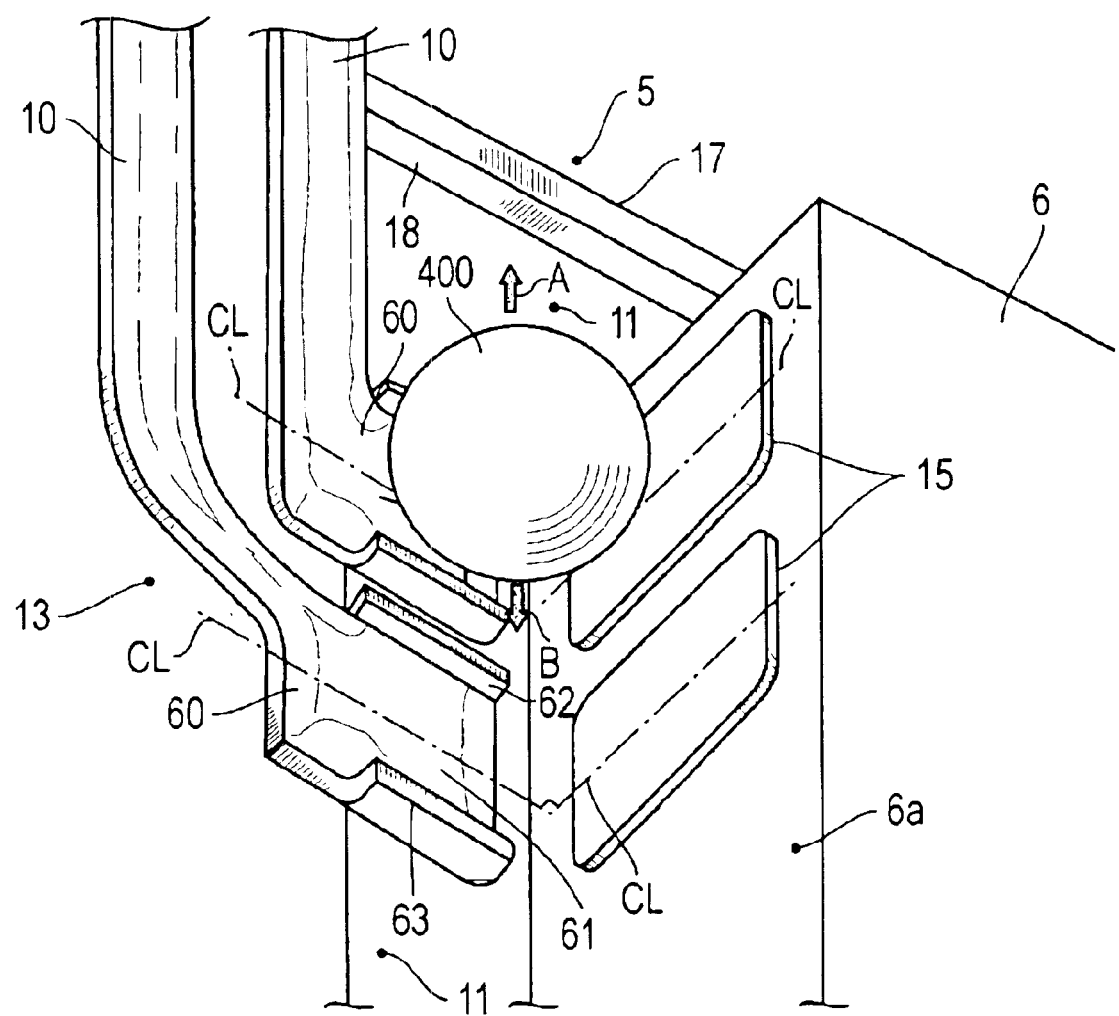
FIG. 10 is an oblique drawing showing an enlarged view of the main parts in an integrated lead suspension according to Embodiment 5 of the present invention.

FIG. 10 is an oblique drawing showing an enlarged view of the main parts in an integrated lead suspension according to Embodiment 5 of the present invention. The only difference between this embodiment and Embodiment 4 is that the shape of the lead wiring pads 60 is different. Otherwise the configuration is the same as that of the integrated lead suspension according to Embodiment 4 shown in FIG. 9.

With a lead wiring pad 60 of this embodiment, the same kind of flat pad as a conventional lead wiring pad shown in FIG. 15 is first formed, in the same way as in Embodiment 4, and then bending is performed on its surface, but in this embodiment both sides of the pad have a bent section. The method of forming a pad of the same kind as a conventional lead wiring pad is the same as in Embodiment 1 or Embodiment 4. In this embodiment, following this, the lead wiring pads 60 are further deformed using a die or the like (not shown), and a bent section 62 and bent section 63 are bent upward from each lead wiring pad 60 as shown in FIG. 10. As a result, a bent section (raised section) 62 and bent section (raised section) 63, bent upward and parallel to the center line CL, are formed on either side of the flat section 61 (recessed section) on each lead wiring pad 60 of this embodiment.

As bent section 62 and bent section 63 are rectangular and formed so that the long sides are parallel to the center line CL, and are bent upward, a solder ball 400 is dropped onto the flat section 61—that is, between bent section 62 and bent section 63—under the force of gravity, and is temporarily fixed so that the center of the solder ball 400 substantially coincides with the center line CL on the flat section 61 and does not move in the virtual right angle axis direction between the two pads. As a result, the solder ball 400 will no longer move even if subjected to some kind of stress in the virtual right angle axis direction (direction A or direction B shown in FIG. 9) due to the subsequent injection of nitrogen gas, etc., or vibration when the optical apparatus 200 moves, for example.

In this embodiment, a bent section 62 and bent section 63 are formed parallel to the center line CL on a lead wiring pad 60, but a bent section 62 and bent section 63 may also be formed at a sloping angle centered on the center line CL, as long as their shape enables a solder ball 400 to be dropped between them under the force of gravity.

Thus, with an integrated lead suspension of this embodiment, through the provision of a bent section 62 and bent section 63 on a lead wiring pad 60, in the same way as in the other embodiments described above, the center of a solder ball 400 substantially coincides with the center line CL of the lead wiring pad 60, and is temporarily fixed so that it does not move in the virtual right angle axis direction between the two pads, as a result of which the solder ball 400 will no longer move in the right angle axis direction even if subjected to some kind of stress in the virtual right angle axis direction due to subsequent injection of an inert gas or movement of the optical apparatus 200, for example, thereby enabling the good solder connection state shown in FIG. 5 to be achieved.

Figure 11:
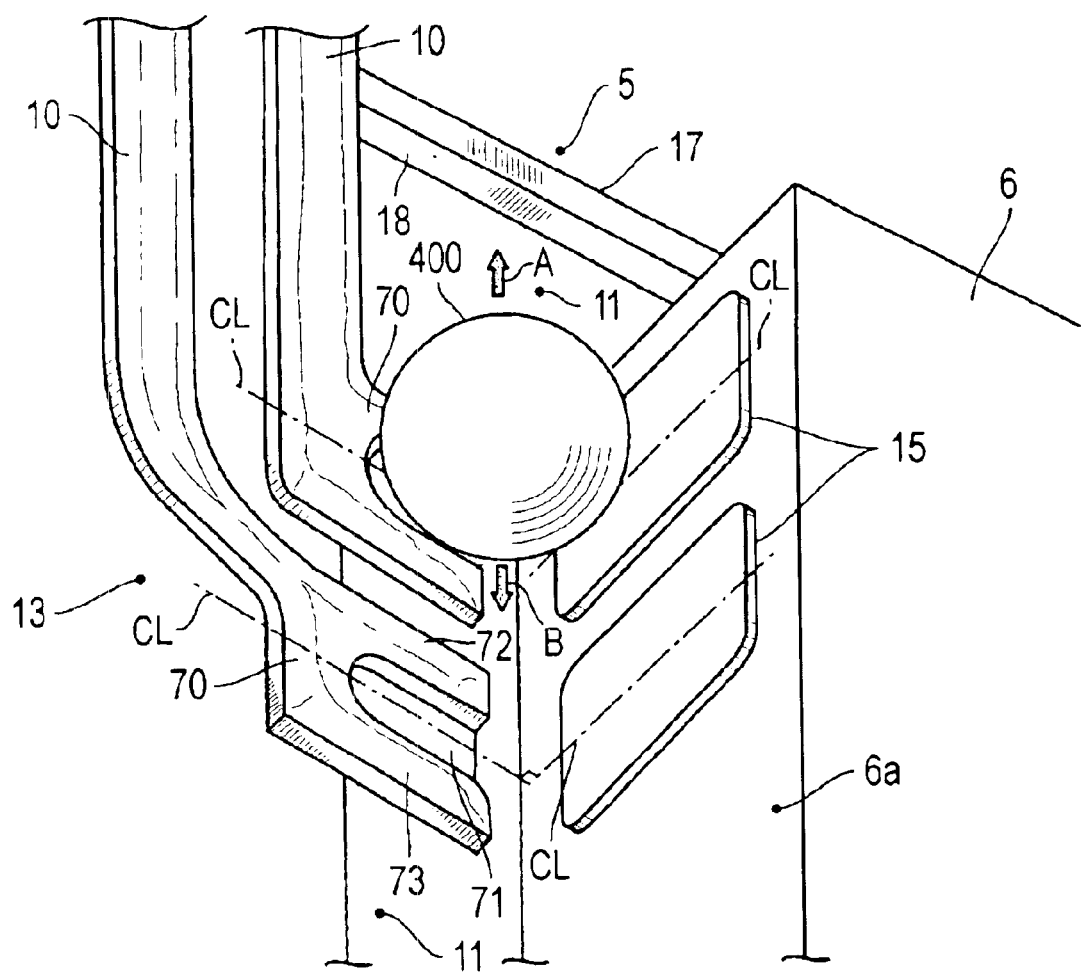
FIG. 11 is an oblique drawing showing an enlarged view of the main parts in an integrated lead suspension according to Embodiment 6 of the present invention.

FIG. 11 is an oblique drawing showing an enlarged view of the main parts in an integrated lead suspension according to Embodiment 6 of the present invention. The only difference between this embodiment and Embodiment 1 is that the shape of the lead wiring pads 70 is different. Otherwise the configuration is the same as that of the integrated lead suspension according to Embodiment 1 shown in FIGS. 1–6.

With a lead wiring pad 70 of this embodiment, the same kind of pad as a conventional lead wiring pad shown in FIG. 15 is first formed, in the same way as in Embodiment 1, and then press working is further performed on that pad. The method of forming a pad of the same kind as a conventional lead wiring pad is the same as in Embodiment 1. In this embodiment, following this, the lead wiring pads 70 are further press-deformed using a die or the like (not shown), and the sunken section (recessed section) 71 shown in FIG. 11 is formed in each lead wiring pad 70. As a result, a sunken section 71 is formed along the center line CL in each lead wiring pad 70 of this embodiment, and on either side of the sunken section 71 are formed a raised section 72 and a raised section 73.

The sunken section 71 in this embodiment is of a similar U-shape to that in Embodiment 2 and is formed so that its center coincides with the center line CL, and there is a difference in level between the sunken section 71, and raised section 72 and raised section 73 on either side of the sunken section 71, in the same way as in Embodiment 1, so that a solder ball 400 is dropped into the sunken section 71—that is, between raised section 72 and raised section 73—under the force of gravity, and is temporarily fixed so that the center of the solder ball 400 substantially coincides with the center line CL on the sunken section 71 and does not move in the virtual right angle axis direction between the two pads. As a result, the solder ball 400 will no longer move even if subjected to some kind of stress in the virtual right angle axis direction (direction A or direction B shown in FIG. 11) due to the subsequent injection of nitrogen gas, etc., or vibration when the optical apparatus 200 moves, for example. The dimensions of the U-shape can be set in the same way as in Embodiment 2.

In this embodiment, a U-shaped sunken section 71 is formed on a lead wiring pad 70 centered on the center line CL with the opening side facing downward, as in Embodiment 2, but a sunken section of a different shape centered on the center line CL may also be formed as long as its shape enables a solder ball 400 to be dropped into it under the force of gravity.

The difference in level formed by the sunken section 71 need not be a sharply-defined difference in level as shown in FIG. 11, but, for example, may be configured so that the sunken section 71 sinks gently below raised section 72 and raised section 73 on a curved surface, or may be configured so that the sunken section 71 sinks gently below raised section 72 and raised section 73 on an inclined surface.

Thus, with an integrated lead suspension of this embodiment, through the provision of a sunken section 71 in a lead wiring pad 70, in the same way as in the other embodiments described above, the center of a solder ball 400 substantially coincides with the center line CL of the lead wiring pad 70, and is temporarily fixed so that it does not move in the virtual right angle axis direction between the two pads, as a result of which the solder ball 400 will no longer move in the right angle axis direction even if subjected to some kind of stress in the virtual right angle axis direction due to subsequent injection of an inert gas or movement of the optical apparatus 200, for example, thereby enabling the good solder connection state shown in FIG. 5 to be achieved.

Figure 12B:
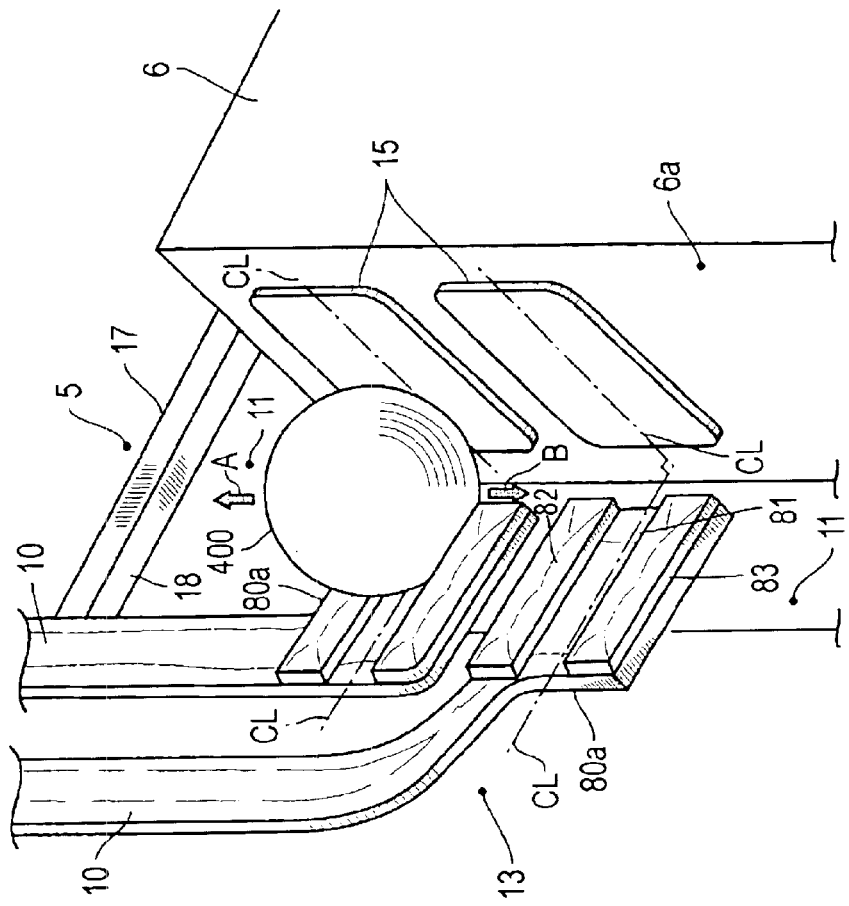
FIG. 12(B) is an oblique drawing showing an enlarged view of the main parts in an integrated lead suspension according to Embodiment 7.
Figure 12A:
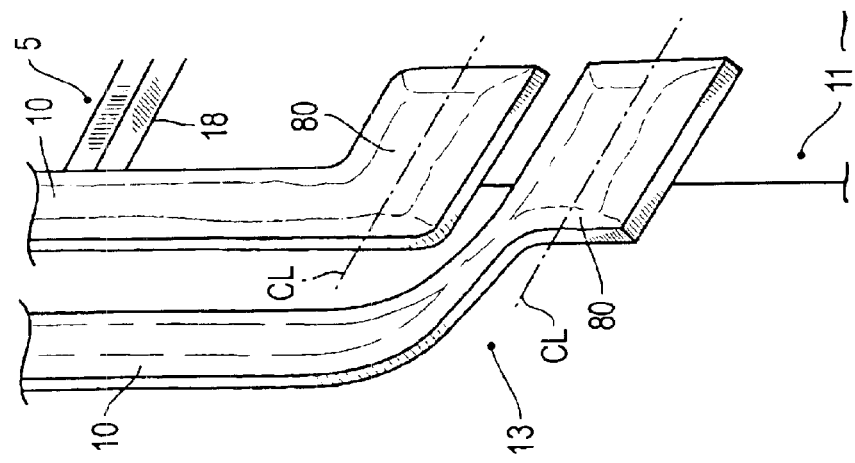
FIG. 12(A) is a drawing showing pads of the same kind as conventional lead wiring pads during the process of manufacture.

FIG. 12 comprises oblique drawings showing enlarged views of the main parts in an integrated lead suspension according to Embodiment 7 of the present invention. FIG. 12(A) is a drawing showing pads of the same kind as conventional lead wiring pads during the process of manufacture, and FIG. 12(B) is a drawing showing lead wiring pads of this embodiment. The only difference between this embodiment and Embodiment 1 is that the shape of the lead wiring pads 80a shown in FIG. 12(B) is different. However, in order to form lead wiring pads 80a, use of an additive type manufacturing method is necessary, and therefore the manufacturing method for an integrated lead suspension of this embodiment is limited to an additive type. Otherwise the configuration is the same as that of the integrated lead suspension according to Embodiment 1 shown in FIGS. 1 through 6.

With a lead wiring pad 80a of this embodiment, a lead wiring pad 80 of the same kind as a conventional lead wiring pad shown in FIG. 12(A) is first formed, in the same way as in Embodiment 1, and then copper plating is added to the areas on both sides excluding the vicinity of the center line CL on the surface of this pad 80. The method of forming a lead wiring pad 80 of the same kind as a conventional lead wiring pad is the same as in Embodiment 1.

A recessed groove section (recessed section) 81, and a raised section 82 and raised section 83, are formed by coating areas other than the vicinity of the center line CL (necessary areas) on the lead wiring pad 80 with a resist, performing Cu (copper) plating, and then removing the resist.

Due to the fact that a recessed groove section 81 of this embodiment is formed so that its center coincides with the center line CL as in Embodiment 1, and that there is a difference in level between the recessed groove section 81, and raised section 82 and raised section 83 on either side of the recessed groove section 81, as in Embodiment 1, a solder ball 400 is dropped into the recessed groove section 81—that is, between raised section 82 and raised section 83—under the force of gravity, and is temporarily fixed so that the center of the solder ball 400 substantially coincides with the center line CL on the recessed groove section 81 and does not move in the virtual right angle axis direction between the two pads. As a result, the solder ball 400 will no longer move even if subjected to some kind of stress in the virtual right angle axis direction (direction A or direction B shown in FIG. 12(B)) due to the subsequent injection of nitrogen gas, etc., or vibration when the optical apparatus 200 moves, for example. The dimensions of the recessed groove section can be set in the same way as in Embodiment 1.

In this embodiment, a recessed groove section 81 of the same kind of shape as in Embodiment 1 is formed in a lead wiring pad 80a, centered on the center line CL, but a recessed section of a different shape may also be formed centered on the center line CL, as long as its shape enables a solder ball 400 to be dropped into it under the force of gravity.

The difference in level formed by the recessed groove section 81 need not be a sharply-defined difference in level as shown in FIG. 12, but, for example, may be configured so that the recessed groove section 81 sinks gently below raised section 82 and raised section 83 on a curved surface, or may be configured so that the recessed groove section 81 sinks gently below raised section 82 and raised section 83 on an inclined surface.

Thus, with an integrated lead suspension of this embodiment, through the provision of a recessed groove section 81 in a lead wiring pad 80a, in the same way as in the other embodiments described above, the center of a solder ball 400 substantially coincides with the center line CL of the lead wiring pad 80a, and is temporarily fixed so that it does not move in the virtual right angle axis direction between the two pads, as a result of which the solder ball 400 will no longer move in the right angle axis direction even if subjected to some kind of stress in the virtual right angle axis direction due to subsequent injection of an inert gas or movement of the optical apparatus 200, for example, thereby enabling the good solder connection state shown in FIG. 5 to be achieved.

Figure 13B:
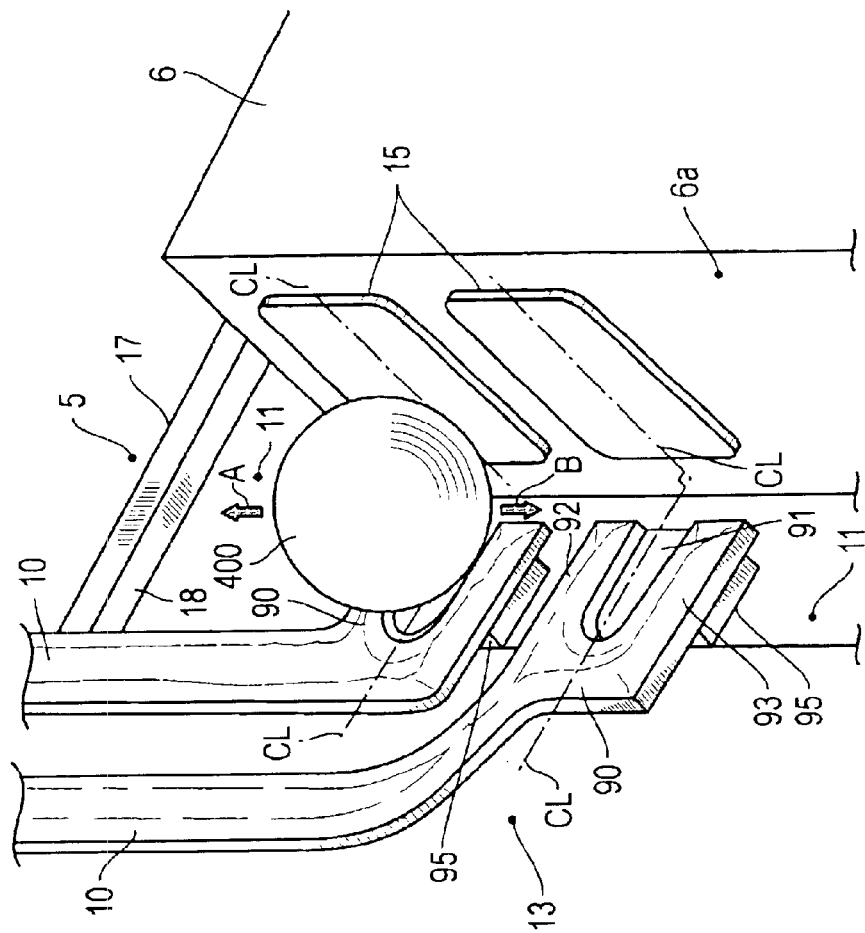
FIG. 13(B) is an oblique drawing showing an enlarged view of the main parts in an integrated lead suspension according to Embodiment 8.
Figure 13A:
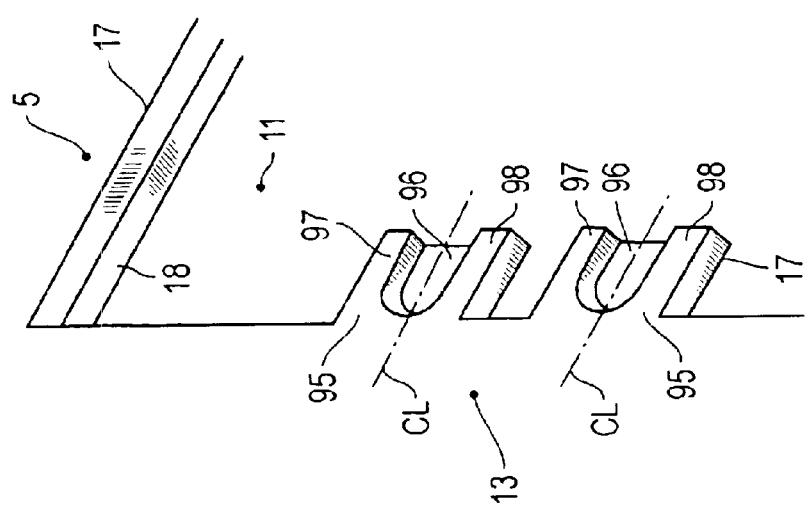
FIG. 13(A) is a drawing showing pad base sections formed by etching, etc., on a polyimide layer, which is insulating polymeric material, during the process of manufacture.

FIG. 13 comprises oblique drawings showing enlarged views of the main parts in an integrated lead suspension according to Embodiment 8 of the present invention. FIG. 13(A) is a drawing showing pad base sections formed by etching, etc., on a polyimide layer, which is insulating polymeric material, during the process of manufacture, and FIG. 13(B) is a drawing showing lead wiring pads of this embodiment.

The only differences between this embodiment and Embodiment 1 are that the pad base sections 95 shown in FIG. 13(A) are formed on a polyimide layer 17, and that the shape of the lead wiring pads 90 shown in FIG. 13(B) is different. However, in order to form lead wiring pads 90 on the pad base sections 95, use of an additive type manufacturing method is necessary, and therefore the manufacturing method for an integrated lead suspension of this embodiment is limited to an additive type. Otherwise the configuration is the same as that of the integrated lead suspension according to Embodiment 1 shown in FIGS. 1 through 6.

Pad base sections 95 of this embodiment are formed, for example, by a process in which the polyimide layer 17 is etched when an integrated lead suspension is manufactured. At this time, following normal etching to obtain the external shape of pad base sections 95 from the polyimide layer 17, half-etching is performed with resist applied in a shape excluding U-shaped underlying recessed section 96 parts with the opening side facing downward so that the center line CL and center axis coincide. If the polyimide layer 17 is a photosensitive polyimide layer, pad base sections 95 are formed by a process in which the polyimide layer 17 is exposed and developed when an integrated lead suspension is manufactured, and the U-shaped underlying recessed sections 96, base raised sections 97, and base raised sections 98 shown in FIG. 13(A) are formed by performing exposure and development after applying resist in a shape excluding the U-shaped underlying recessed section 96 parts.

Next, as with a conventional additive type manufacturing method, leads 10, lead wiring pads 90, and so forth, are formed on the polyimide layer 17 by copper plating. At this time, raised sections 92 and raised sections 93 forming the two sides of each lead wiring pad 90 formed by copper plating are formed to the same height as in Embodiment 1 on the base raised sections 97 and base raised sections 98 of the polyimide layer 17. However, a greater degree of depression occurs on each U-shaped underlying recessed section 96 of the polyimide layer 17 than on the areas on either side, as in Embodiment 6, and a U-shaped sunken section (recessed section) 91 is formed in each lead wiring pad 90 formed by copper plating. The dimensions of the U-shape can be set in the same way as in Embodiment 2.

Due to the fact that a U-shaped sunken section 91 of this embodiment is formed so as to be of a similar U-shape to that in Embodiment 6 and so that its center coincides with the center line CL, and that there is a difference in level between the sunken section 91, and raised section 92 and raised section 93 on either side of the sunken section 91, as in Embodiment 1, a solder ball 400 is dropped into the sunken section 91—that is, between raised section 92 and raised section 93—under the force of gravity, and is temporarily fixed so that the center of the solder ball 400 substantially coincides with the center line CL on the sunken section 91 and does not move in the virtual right angle axis direction between the two pads. As a result, the solder ball 400 will no longer move even if subjected to some kind of stress in the virtual right angle axis direction (direction A or direction B shown in FIG. 13(B)) due to the subsequent injection of nitrogen gas, etc., or vibration when the optical apparatus 200 moves, for example.

In this embodiment, a sunken section 91 of the same kind of U-shape as in Embodiment 6 is formed in a lead wiring pad 90, centered on the center line CL, but a sunken section of a different shape may also be formed centered on the center line CL, as long as its shape enables a solder ball 400 to be dropped into it under the force of gravity.

The difference in level formed by the sunken section 91 need not be a sharply-defined difference in level as shown in FIG. 13, but, for example, may be configured so that the sunken section 91 sinks gently below raised section 92 and raised section 93 on a curved surface, or may be configured so that the sunken section 91 sinks gently below raised section 92 and raised section 93 on an inclined surface.

Thus, with an integrated lead suspension of this embodiment, through the provision of a sunken section 91 in a lead wiring pad 90, in the same way as in the other embodiments described above, the center of a solder ball 400 substantially coincides with the center line CL of the lead wiring pad 90, and is temporarily fixed so that it does not move in the virtual right angle axis direction between the two pads, as a result of which the solder ball 400 will no longer move in the right angle axis direction even if subjected to some kind of stress in the virtual right angle axis direction due to subsequent injection of an inert gas or movement of the optical apparatus 200, for example, thereby enabling the good solder connection state shown in FIG. 5 to be achieved.

Figure 14B:
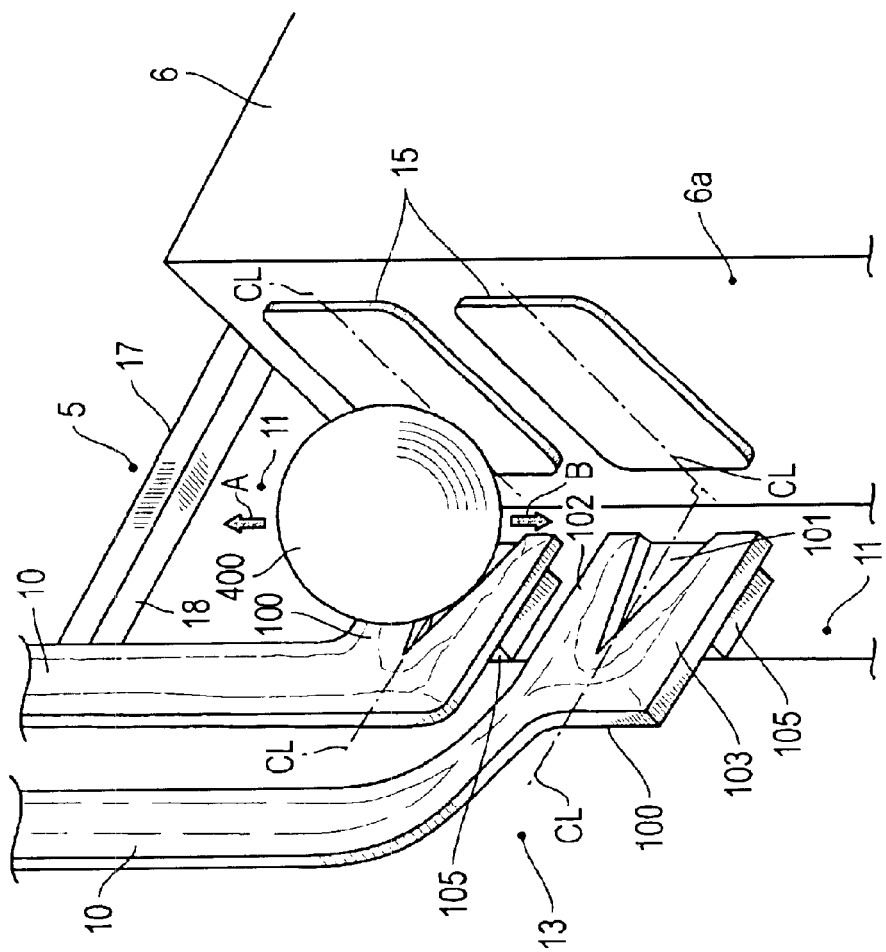
FIG. 14(B) is an oblique drawing showing an enlarged view of the main parts in an integrated lead suspension according to Embodiment 9.
Figure 14A:
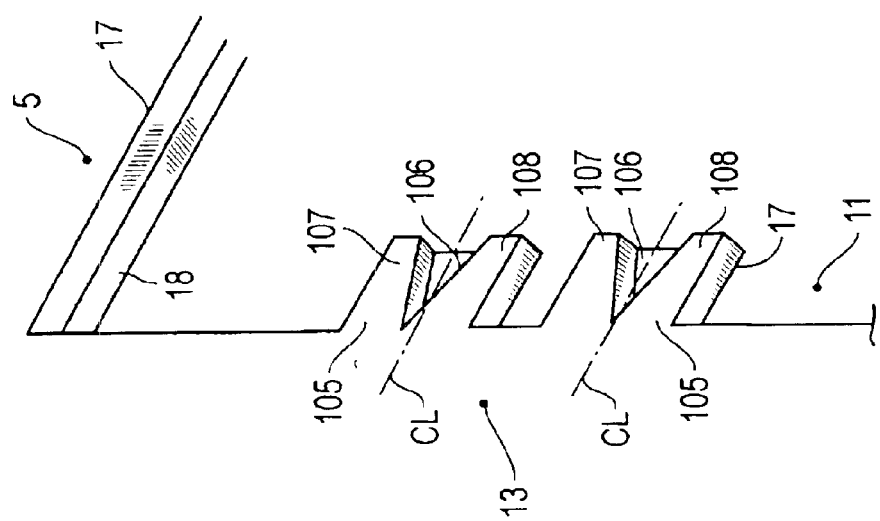
FIG. 14(A) is a drawing showing pad base sections formed by etching, etc., on a polyimide layer, which is insulating polymeric material, during the process of manufacture.

FIG. 14 comprises oblique drawings showing enlarged views of the main parts in an integrated lead suspension according to Embodiment 9 of the present invention. FIG. 14(A) is a drawing showing pad base sections formed by etching, etc., on a polyimide layer, which is insulating polymeric material, during the process of manufacture, and FIG. 14(B) is a drawing showing lead wiring pads of this embodiment.

The only difference between this embodiment and Embodiment 8 is that the shape of the pad base sections 105 shown in FIG. 14(A) and the shape of the lead wiring pads 100 shown in FIG. 14(B) are different, the fact that the manufacturing method for an integrated lead suspension of this embodiment is limited to an additive type being a point of similarity with Embodiment 8. Otherwise the configuration is the same as that of the integrated lead suspension according to Embodiment 8 shown in FIG. 13.

Pad base sections 105 of this embodiment are formed, for example, by a process in which the polyimide layer 17 is etched when an integrated lead suspension is manufactured. At this time, following normal etching to obtain the external shape of pad base sections 105 from the polyimide layer 17, half-etching is performed with resist applied in a shape excluding V-shaped underlying recessed section 106 parts with the opening side facing downward so that the center line CL and center axis coincide. If the polyimide layer 17 is a photosensitive polyimide layer, pad base sections 105 are formed by a process in which the polyimide layer 17 is exposed and developed when an integrated lead suspension is manufactured, and the V-shaped underlying recessed sections 106, base raised sections 107, and base raised sections 108 shown in FIG. 14(A) are formed by performing exposure and development after applying resist in a shape excluding the V-shaped underlying recessed section 106 parts.

Next, as with a conventional additive type manufacturing method, leads 10, lead wiring pads 100, and so forth, are formed on the polyimide layer 17 by copper plating. At this time, raised sections 102 and raised sections 103 forming the two sides of each lead wiring pad 100 formed by copper plating are formed to the same height as in Embodiment 1 on the base raised sections 107 and base raised sections 108 of the polyimide layer 17. However, a greater degree of depression occurs on each V-shaped underlying recessed section 106 of the polyimide layer 17 than on the areas on either side, and a V-shaped sunken section (recessed section) 101 is formed in each lead wiring pad 100 formed by copper plating. The dimensions of the V-shape can be set in the same way as in Embodiment 3.

Due to the fact that a V-shaped sunken section 101 of this embodiment is formed so that the center of the V coincides with the center line CL, and that there is a difference in level between the sunken section 101, and raised section 102 and raised section 103 on either side of the sunken section 101, as in Embodiment 1, a solder ball 400 is dropped into the sunken section 101—that is, between raised section 102 and raised section 103—under the force of gravity, and is temporarily fixed so that the center of the solder ball 400 substantially coincides with the center line CL on the sunken section 101 and does not move in the virtual right angle axis direction between the two pads. As a result, the solder ball 400 will no longer move even if subjected to some kind of stress in the virtual right angle axis direction (direction A or direction B shown in FIG. 14(B)) due to the subsequent injection of nitrogen gas, etc., or vibration when the optical apparatus 200 moves, for example.

In this embodiment, a V-shaped sunken section 101 is formed in a lead wiring pad 100, centered on the center line CL, but a sunken section of a different shape may also be formed centered on the center line CL, as long as its shape enables a solder ball 400 to be dropped into it under the force of gravity.

The difference in level formed by the sunken section 101 need not be a sharply-defined difference in level as shown in FIG. 14, but, for example, may be configured so that the sunken section 101 sinks gently below raised section 102 and raised section 103 on a curved surface, or may be configured so that the sunken section 101 sinks gently below raised section 102 and raised section 103 on an inclined surface.

Thus, with an integrated lead suspension of this embodiment, through the provision of a sunken section 101 in a lead wiring pad 100, in the same way as in the other embodiments described above, the center of a solder ball 400 substantially coincides with the center line CL of the lead wiring pad 100, and is temporarily fixed so that it does not move in the virtual right angle axis direction between the two pads, as a result of which the solder ball 400 will no longer move in the right angle axis direction even if subjected to some kind of stress in the virtual right angle axis direction due to subsequent injection of an inert gas or movement of the optical apparatus 200, for example, and moreover, the fact that the shape of the sunken section 101 is a V also makes it difficult for the solder ball 400 to move toward the apex of the V, and so makes the solder ball 400 all the more stable, thereby enabling the good solder connection state shown in FIG. 5 to be achieved.

In the above-described embodiments, when a bonding pad and lead wiring pad are connected by means of a solder ball, the virtual angle formed between that bonding pad and lead wiring pad is assumed to be a right angle, but this angle may be changed to any angle as long as it is an angle that enables a solder ball 400 to be caught.

Similarly, in the above-described embodiments, a lead wiring pad and bonding pad fixes a flexure as to both be at an angle of 45 degrees above the horizontal, but this angle also may be changed to any angle as long as it is an angle that enables a solder ball 400 to be caught.

Also, in the above-described embodiments, cases of a groove, a V-shape, and a U-shape are mentioned with regard to the shape of recessed sections, but the advantages of the present invention can also be obtained with recessed sections of any shape, including circular, oval, rectangular, or rhomboidal.

As described above, with a integrated lead suspension of the present invention, through the provision of a recessed section in a lead wiring pad, the center of a solder ball substantially coincides with the center line of the lead wiring pad, and is temporarily fixed so that it does not move in a virtual right angle axis direction between the two pads, as a result of which the solder ball no longer moves in a right angle axis direction even if subjected to some kind of stress in the virtual right angle axis direction due to subsequent injection of an inert gas, movement of the optical apparatus, or the like, thereby enabling a good solder connection state to be achieved.

Also, with the present invention in which a recessed section in a lead wiring pad is made V-shaped, in addition to the above-described advantage, the fact that the shape of the recessed section is a V also makes it difficult for a solder ball to move toward the apex of the V, and so makes the solder ball more stable, thereby enabling a good solder connection state to be achieved.

What is claimed:

1. An integrated lead suspension, comprising:
    a lead wiring pad provided on a flexure section of the suspension, a bonding pad provided on a slider of a head gimbal section of the suspension, and a solder ball that is placed between the lead wiring pad and the bonding pad, so that the solder ball is melted to solder the lead wiring pad and the bonding pad together; and
    wherein the lead wiring pad comprises a recessed section into which the solder ball is dropped, using gravitational force, and rolled along a center line of the surface of the lead wiring pad into contact with the bonding pad, such that the solder ball remains in the recessed section from an initial position that is out of contact with the bonding pad to a terminal position that is in contact with the bonding pad wherein, the recessed section comprises a recess extending along the centerline of the pad.

2. The integrated lead suspension of claim 1, wherein in the recessed section, a difference in level is provided between a portion into which the solder ball is dropped and portions on both sides of said portion.

3. The integrated lead suspension of claim 1, wherein in the recessed section, distances from the center line of a portion into which the solder ball is dropped to both sides of the recessed section are equal.

4. The integrated lead suspension of claim 1, wherein the lead wiring pad provides both structural support for and electrical connection with the solder ball.

5. An integrated lead suspension, comprising:

a lead wiring pad provided on a flexure section of the suspension, a bonding pad provided on a slider of a head gimbal section of the suspension, and a solder ball that is placed between the lead wiring pad and the bonding pad, so that the solder ball is melted to solder the lead wiring pad and the bonding pad together; wherein the lead wiring pad comprises a recessed section into which the solder ball is dropped, using gravitational force, adjacent to a center line of the surface of the lead wiring pad; and wherein in the recessed section, a portion into which the solder ball is dropped has a groove shape that is parallel to the center line.

6. The integrated lead suspension of claim 5, wherein the lead wiring pad provides both structural support for and electrical connection with the solder ball.

7. An integrated lead suspension, comprising:

a lead wiring pad on a flexure section of the suspension and having a center line, a bonding pad on a slider of a head gimbal section of the suspension, and a solder ball placed between the lead wiring pad and the bonding pad, the solder ball being melted to solder the lead wiring pad and the bonding pad together; and a recess in the lead wiring pad extending along the center line, the recess permitting motion of the solder ball along the center line, and the recess restricting motion of the solder ball in a direction perpendicular to the center line and the bonding pad.

8. The integrated lead suspension of claim 7, wherein the recess is an elongated rectangular notch formed in a surface of the lead wiring pad.

9. The integrated lead suspension of claim 7, wherein the lead wiring pad has a length in a direction of the of the center line, a width that is transverse to the length, and a thickness that is transverse to both the length and the width, the recess has a width, that is approximately half of the width of the lead wiring pad, and the recess has a thickness that is approximately half of the thickness of the lead wiring pad.

10. The integrated lead suspension of claim 7, wherein the lead wiring pad provides both structural support for and connection with the solder ball.

* * * * *